(12) United States Patent
Parkin et al.

(10) Patent No.: US 7,760,535 B2
(45) Date of Patent: Jul. 20, 2010

(54) SEQUENCE OF CURRENT PULSES FOR DEPINNING MAGNETIC DOMAIN WALLS

(75) Inventors: Stuart Parkin, San Jose, CA (US); Luc Thomas, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 232 days.

(21) Appl. No.: 12/124,306

(22) Filed: May 21, 2008

(65) Prior Publication Data

US 2009/0103347 A1  Apr. 23, 2009

Related U.S. Application Data

(63) Continuation of application No. 11/622,644, filed on Jan. 12, 2007, now Pat. No. 7,492,622.

(51) Int. Cl.
  *G11C 19/00* (2006.01)
(52) U.S. Cl. ............................... 365/81; 365/80; 365/87; 365/158; 365/171; 365/225.5; 977/933
(58) Field of Classification Search .................... 365/48, 365/55, 62, 66, 74, 78, 80–93, 100, 130, 365/131, 148, 158, 171–173, 225.5, 243.5; 216/22; 257/421, E21.665; 438/3; 977/933–935
See application file for complete search history.

(56) References Cited

U.S. PATENT DOCUMENTS

| | | | |
|---|---|---|---|
| 3,876,996 A | 4/1975 | Myer | |
| 3,940,750 A | 2/1976 | Voegeli | |
| 4,731,752 A | 3/1988 | Hidaka | |
| 6,727,537 B2 | 4/2004 | Wunderlich | |
| 6,834,005 B1 | 12/2004 | Parkin | |
| 6,898,132 B2 * | 5/2005 | Parkin | ................... 365/189.12 |
| 7,031,178 B2 | 4/2006 | Parkin | |
| 7,236,386 B2 | 6/2007 | Parkin | |
| 2004/0021539 A1 | 2/2004 | Bland et al. | |

(Continued)

OTHER PUBLICATIONS

Barnes, et al.; Current-Spin Coupling for Ferromagnetic Domain Walls in Fine Wires; The American Physical Society; PRL 95, 107204; pp. 1-4; (2005).

(Continued)

*Primary Examiner*—Richard Elms
*Assistant Examiner*—Harry W Byrne
(74) *Attorney, Agent, or Firm*—Schmeiser, Olsen & Watts

(57) ABSTRACT

A method and structure for depinning a domain wall that is in spatial confinement by a pinning potential to within a local region of a magnetic device. At least one current pulse applied to the domain has a pulse length sufficiently close to a precession period of the domain wall motion and the current pulses are separated by a pulse interval sufficiently close to the precession period such that: the at least one current pulse causes a depinning of the domain wall such that the domain wall escapes the spatial confinement; and each current pulse has an amplitude less than the minimum amplitude of a direct current that would cause the depinning if the direct current were applied to the domain wall instead of the at least one current pulse. The pulse length and pulse interval may be in a range of 25% to 75% of the precession period.

24 Claims, 22 Drawing Sheets

U.S. PATENT DOCUMENTS

2004/0251232 A1    12/2004    Chen et al.
2006/0120132 A1    6/2006    Parkin

OTHER PUBLICATIONS

Gan, et al.; Pulsed-Current-Induced Domain Wall Propagation in Permalloy Patterns Observed Using Magnetic Force Microscope; IEEE Transactions on Magnetics, vol. 36, No. 5, Sep. 2000; pp. 3047-3049.

Garcia, et al.; Magnetoresistance in Ballistic Nanocontacts and Its Manipulation in Electrodeposited Nanometric Ni Contacts; IEEE Transactions on Magnetics, vol. 36, No. 5, Sep. 2000; pp. 2833-2838.

Jubert, et al.; Current Induced Modifications of Domain Wall; Magnetics Conference, 2005; INTERMAG Asia 2005; Digests of the IEEE International; Apr. 4-8, 2005; pp. 137-138.

Klaui, et al.; Critical Parameters for Current-Induced Domain Wall Motion; Magnetics Conference, 2005; INTERMAG Asia 2005; Digests of the IEEE International; Apr. 4-8, 2005; pp. 1007-1008.

Ohtomo, et al.; Domain Wall Motion in Permalloy Thin Film Cores With Toroidal and Multi-Aperture Configuration; IEEE Transactions on Magnetics, vol. Mag-15, No. 6, Nov. 1979; pp. 1827-1829.

Slonczewski, J.C.; Current-driven excitation of magnetic multilayers; Journal of magnetism and Magnetic Materials 159; pp. L1-L7; (1996).

Tatara, et al.; Theory of Current-Driven Domain Wall Motion: Spin Transfer versus Momentum Transfer; The American Physical Society; Physical Review Letters, vol. 92, No. 8; 086601; pp. 1-4; (2004).

Thiaville, et al.; Micromagnetic understanding of current-driven domain wall motion in patterned nanowires; EDP Sciences; Europhysics Letters, 69 (6); pp. 990-996; (2005).

Zhang, et al.; Roles of Nonequilibrium Conduction Electrons on the Magnetization Dynamics of Ferromagnets; The American Physical Society, Physical Review Letters, vol. 93, No. 12; 127204; pp. 1-4; (2004).

Notice of Allowance (Mail Date Oct. 7, 2008) for U.S. Appl. No. 11/622,644, filed Jan. 12, 2007.

Ohtomo et al.; Domain Wall Motion in Permalloy Thin Film Cores With Toroidal and Multi-Aperture Configuration; IEEE Transactions on Magnetics, vol. Mag-15, No. 6, Nov. 1979; pp. 1827-1829.

* cited by examiner

SEQUENCE OF CURRENT PULSES FOR DEPINNING MAGNETIC DOMAIN WALLS

This application is a continuation application claiming priority to Ser. No. 11/622,644, filed Jan. 12, 2007.

STATEMENT REGARDING FEDERALLY SPONSORED RESEARCH OR DEVELOPMENT

This invention was made with government support under Cooperative Agreement No. H94003-05-2-0505 awarded by the U.S. Department of Defense. The government has certain rights in the invention.

CROSS REFERENCE TO RELATED APPLICATIONS

This patent application is related to co-pending U.S. patent application Ser. No. 11/004,413, filed Dec. 4, 2004, titled "System and Method For Transferring Data To and From a Magnetic Shift Register With a Shiftable Data Column", which is related to U.S. patent application Ser. No. 10/458,554, filed Jun. 10, 2003, titled "Shiftable Magnetic Shift Register and Method of Using the Same", now issued as U.S. Pat. No. 6,834,005.

FIELD OF THE INVENTION

The present invention relates to moving magnetic domain walls by current pulses.

BACKGROUND OF THE INVENTION

Semiconductor magnetoresistive random access memory (MRAM) stores data as direction of magnetic moment in a ferromagnetic material. Atoms in ferromagnetic materials respond to external magnetic fields, aligning their magnetic moments to the direction of the applied magnetic field. When the field is removed, the magnetic moments still remain aligned in the induced direction. A field applied in the opposite direction can cause the magnetic moments to realign themselves with the new direction if the field is large enough. Typically, the magnetic moments of the atoms within a volume of the ferromagnetic material are aligned parallel to one another by a magnetic exchange interaction. These magnetic moments then respond together, largely as one macro-magnetic moment, or magnetic domain, to the external magnetic field A domain wall between magnetic domains may be spatially confined by a potential well such that a substantial amount of applied energy is required to move the domain wall away from the potential well to no longer be spatially confined by the potential well. Thus there is a need to provide a method and structure for moving the domain wall away from the potential well to no longer be spatially confined by the potential well, by using less applied energy than is presently used in the related art.

SUMMARY OF THE INVENTION

The present invention provides a method for depinning a domain wall, comprising applying at least one current pulse to a domain wall that is in spatial confinement by a pinning potential to within a local region of a magnetic device, wherein each current pulse has a pulse length sufficiently close to a precession period of the domain wall motion and if the at least one current pulse comprises at least two current pulses then the current pulses are separated from each other by a pulse interval sufficiently close to the precession period such that:

the at least one current pulse is configured to cause a depinning of the domain wall such that the domain wall moves with sufficient energy to escape the spatial confinement; and each current pulse has an amplitude less than the minimum amplitude of a direct current that would cause said depinning if the direct current were applied to the domain wall instead of the at least one current pulse.

The present invention provides a method for depinning a domain wall, comprising:

applying at least one current pulse to a domain wall that is in spatial confinement by a pinning potential to within a local region of a magnetic device, wherein each current pulse has a pulse length in a range of 25% to 75% of a precession period of the domain wall motion and if the at least one current pulse comprises at least two current pulses then the current pulses are separated from each other by a pulse interval in the range of 25% to 75% of the precession period, and wherein the applied at least one current pulse is configured to cause a depinning of the domain wall such that the domain wall moves with sufficient energy to escape the spatial confinement.

The present invention provides a structure, comprising a domain wall that is in spatial confinement by a pinning potential to within a local region of a magnetic device and at least one current pulse applied to the domain wall, wherein each current pulse has a pulse length sufficiently close to a precession period of the domain wall motion and if the at least one current pulse comprises at least two current pulses then the current pulses are separated from each other by a pulse interval sufficiently close to the precession period such that:

the at least one current pulse is configured to cause a depinning of the domain wall such that the domain wall moves with sufficient energy to escape the spatial confinement; and each current pulse has an amplitude less than the minimum amplitude of a direct current that would cause said depinning if the direct current were applied to the domain wall instead of the at least one current pulse.

The present invention provides a structure, comprising:

a domain wall that is in spatial confinement by a pinning potential to within a local region of a magnetic device; and at least one current pulse applied to the domain wall, wherein each current pulse has a pulse length in a range of 25% to 75% of a precession period of the domain wall motion and if the at least one current pulse comprises at least two current pulses then the current pulses are separated from each other by a pulse interval in the range of 25% to 75% of the precession period, and wherein the applied at least one current pulse is configured to cause a depinning of the domain wall such that the domain wall moves with sufficient energy to escape the spatial confinement.

The present invention provides a method and structure for moving the domain wall away from the potential well to no longer be spatially confined by the potential well, by using less applied energy than is presently used in the related art.

BRIEF DESCRIPTION OF THE DRAWINGS

FIG. 4C is a schematic diagram of another embodiment of the shift register of FIG. 1, illustrating a well or bottom section of the shift register as being composed of a single ferromagnetic material.

DETAILED DESCRIPTION OF THE INVENTION

The present invention provides a method and associated structure for moving magnetic domain walls by using a sequence of synchronized current pulses.

Spin-polarized currents cause the precession of the magnetization of a domain wall trapped in a pinning potential, as a consequence of a spin-transfer torque mechanism. Such a precession occurs for excitation currents smaller than a threshold current (i.e., minimum current) required to move the domain wall outside of the pinning potential with continuous current or in the limit of sufficiently long current pulses. In this case, the amplitude of the domain wall oscillation is maximum after a time of the order of half the intrinsic precession period of the domain wall. This precession period is a function of the characteristics of the domain wall and the pinning potential. For longer times, Gilbert damping causes the amplitude of motion to decrease progressively.

In accordance with embodiments of the present invention, a series of current pulses are applied in synchronization with the precession period of the domain wall, resulting in a resonant amplification embodied in an increase in the amplitude of the precession. This resonant amplification may lead to a strong reduction of the threshold current for domain wall motion by more than one order of magnitude. The reduction of the threshold current is achieved both with a series of pulses of the same polarity, separated by intervals with zero current (unipolar pulses), and a series of pulses of alternate polarity (bipolar pulses). For unipolar pulses, the maximum reduction of the threshold current is obtained when both the pulse length (i.e., duration of individual pulse) and pulse interval (i.e., time between successive pulses) are about half the domain wall precession period. For bipolar pulses, the length of both the positive and negative portions of the pulses is also about half the domain wall precession period. Significant reduction of the threshold current for domain wall motion is achieved even with a small number of pulses. The present invention is supported by analytical calculations, micromagnetic modeling, and experiments.

The detailed description of the present invention comprises sections that describe: (1) a magnetic shift register with a spatially varying distribution of magnetic layers to illustrate the pinning of domain walls; (2) an analytical model for reducing the threshold current to overcome the pinning potential by domain wall motion; (3) quantitative results from use of the analytical model; (4) micromagnetic simulations; and (5) experimental support for the analytical model.

1. Magnetic Shift Register with Pinning Potential

Figure 1:
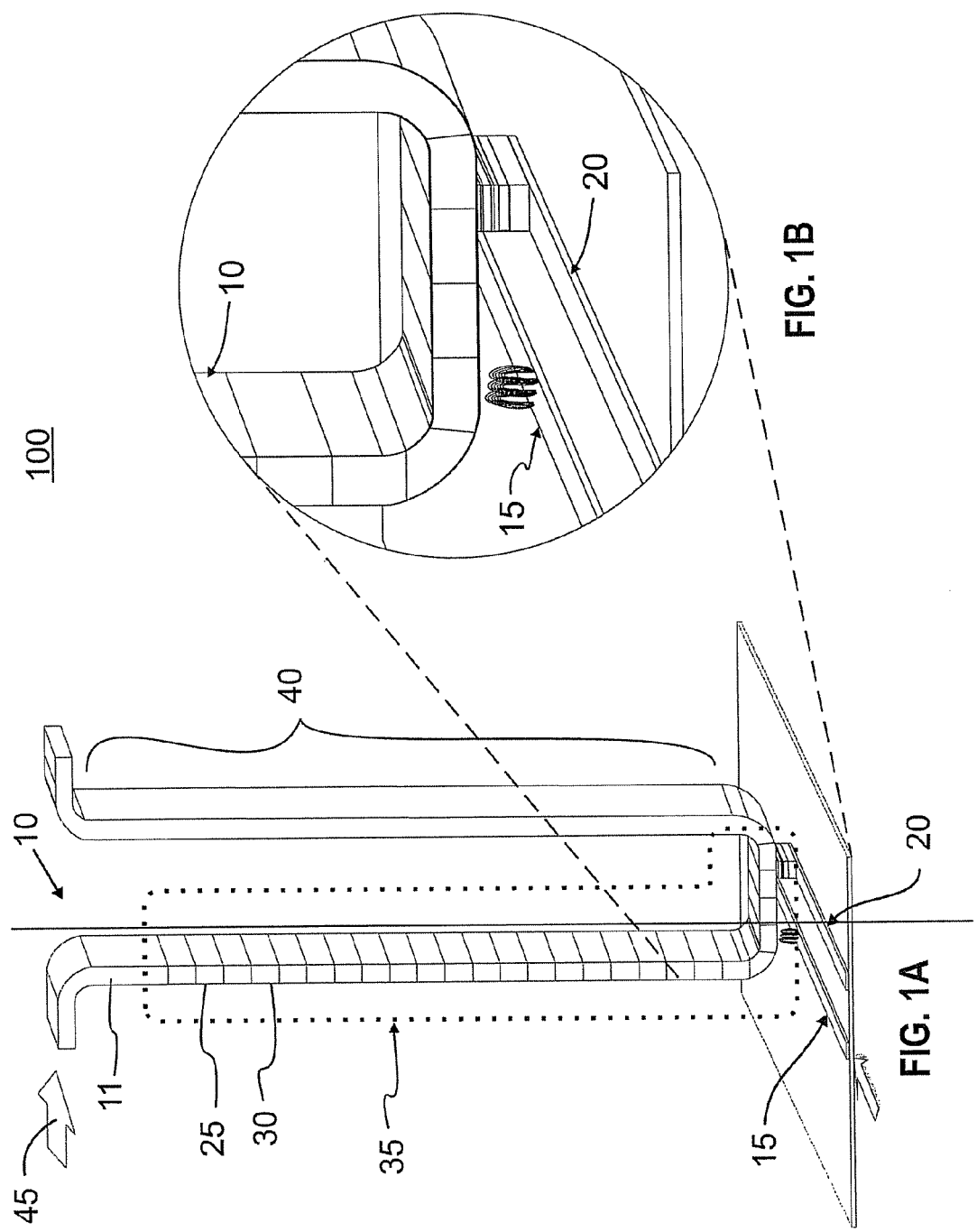
FIG. 1 is comprised of FIGS. 1A and 1B, and represents a schematic illustration of an exemplary operating environment in which a magnetic shift register system of the present invention can be used.

FIG. 1 (FIGS. 1A and 1B) illustrates an exemplary high-level architecture of a magnetic memory system 100 comprising a magnetic shift register 10 that utilizes a writing device (also referred to herein as writing element) 15 and a reading device (also referred to herein as reading element) 20. Both the reading device 20 and the writing device 15 form a read/write element of system 100.

The magnetic shift register 10 comprises a fine track 11, called "racetrack memory", made of ferromagnetic material. The track 11 can be magnetized in small sections, or domains, in one direction or another. Information is stored in regions such as domains 25, 30 in the track 11. The order parameter of the magnetic material from which the track is fabricated, which is the magnetization direction or the direction of the magnetic moment, changes from one direction to another. This variation in the direction of the magnetic moment forms the basis for storing information in the track 11.

In one embodiment, the magnetic shift register 10 comprises a data region 35 and a reservoir 40. The data region 35 comprises a contiguous set of domains such as domains 25, 30 that store data. Additional length is provided to the magnetic shift register 10 in the form of a reservoir 40.

The reservoir 40 is made sufficiently long so that it accommodates all the domains in the region 35 when these domains are moved completely from region 35 across the writing and reading elements for the purposes of writing and reading domains into region 40. At any given time, the domains are thus stored partially in region 35 and partially in region 40 so it is the combination of region 35 and region 40 that forms the storage element. In one embodiment, the reservoir 40 is wherein the reservoir region is devoid of magnetic domains in a quiescent state.

Thus, the storage region 35 at any given time may be located within a different portion of the magnetic shift register 10 and the reservoir 40 would be divided into two regions on either side of the storage region 35. Although the storage region 35 is one contiguous region, and in one embodiment of this application the spatial distribution and extent of the domains within the storage region 35 would be approximately the same no matter where the storage region 35 resides within the shift register 10, in another embodiment portions of the storage region may be expanded during the motion of this region particularly across the reading and writing elements. A portion or all of the data region 35 is moved into the reservoir 40 to access data in specific domains.

The reservoir 40 is shown in FIG. 1 as approximately the same size as the data region 35. However, other alternative embodiments may allow the reservoir 40 to have a different size than the data region 35. As an example, the reservoir 40 could be much smaller than the data region 35 if more than one reading and writing element were used for each magnetic shift register. For example, if two reading and writing elements were used for one shift register and were disposed equally along the length of the data region, then the reservoir would only need to be approximately half as long as the data region.

An electric current 45 is applied to the track 11 to move the magnetic moments within domains 25, 30, along the track 11, past the reading device 20 or the writing device 15. In a magnetic material with domain walls, a current passed across the domain walls moves the domain walls in the direction of the current flow. As the current passes through a domain, it becomes "spin polarized". When this spin polarized current passes through into the next domain across the intervening domain wall, it develops a spin torque. This spin torque moves the domain wall. The direction of motion of the domain walls depends on the magnetic material and the domain walls may move in the direction of the current flow or in the opposite direction (i.e., the direction of the flow of electrons). The direction of motion is not important for the purposes of the racetrack memory. Domain wall velocities can be very high; e.g., on the order of 100 m/sec, so that the process of moving a particular domain to the required position for the purposes of reading this domain or for changing its magnetic state by means of the writing element can be very short.

Figure 2:
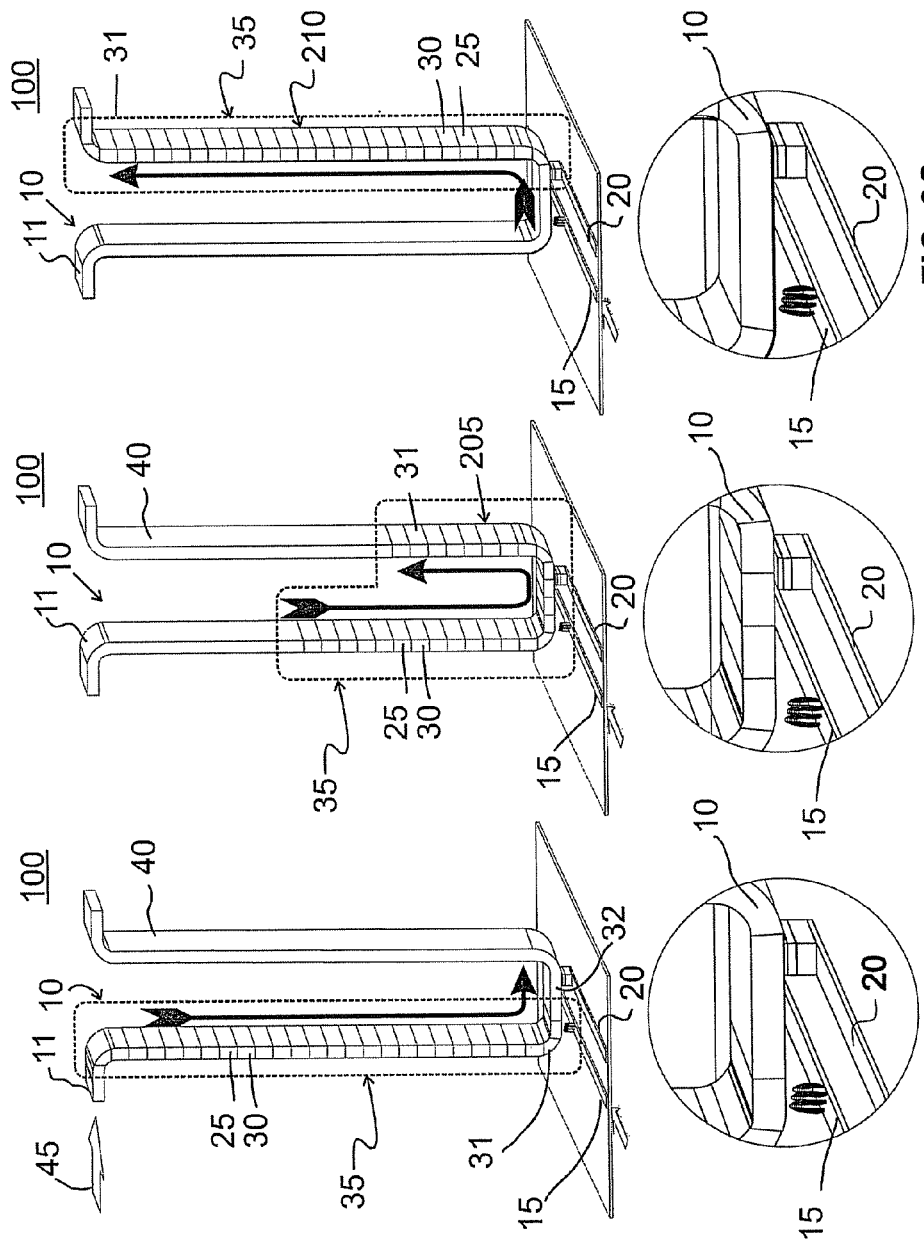
FIG. 2 is comprised of FIGS. 2A, 2B, and 2C and represents a schematic diagram illustrating a method of operation of the magnetic shift register of FIG. 1.

The domains, such as domains 25, 30, 31 are moved (or shifted) back and forth over the writing device 15 and reading device 20, in order to move the data region 35 in and out of the reservoir 40, as shown in FIG. 2 (FIGS. 2A, 2B, 2C). In the example of FIG. 2A, the data region 35 could initially reside on the left side of the well, i.e., bottom section 32, of the magnetic shift register 10, with no domains in the reservoir 40. FIG. 2C shows the case where the data region 35 resides entirely on the right side of the magnetic shift register 10.

In order to write data in a specific domain, such as domain 31, a current 45 is applied to the magnetic shift register 10 to move domain 31 over, and in alignment with the writing device 15. All the domains in the data region 35 move when the current is applied to the magnetic shift register.

The movement of the domains is controlled by both the amplitude and direction (i.e., polarity) of the current, and the time over which the current is applied. In one embodiment, one current pulse of a specified shape (amplitude versus time) and duration is applied to move the domains in the storage region in one increment or step. A series of pulses are applied to move the domains the required number of increments or steps. Thus, a shifted portion 205 (FIG. 2B) of the data region 35 is pushed (shifted or moved) into the reservoir region 40. The direction of motion of the domains within the track 11 depends on the direction of the applied current.

In order to read data in a specific domain, such as domain 25, additional current is applied to the magnetic shift register 10 to move domain 25 over, and in alignment with the reading device 20. A larger shifted portion 210 of the data region 35 is pushed (shifted or moved) into the reservoir 40.

The reading and writing devices shown in FIGS. 1 and 2 form part of a control circuit that defines a reference plane in which the reading and writing devices are arrayed. In one embodiment, the magnetic shift register 10 stands vertically out of this reference plane, largely orthogonal to this plane.

In order to operate the magnetic shift register 10, the control circuit includes, in addition to the reading and writing elements, logic and other circuitry for a variety of purposes, including the operation of the reading and writing devices, the provision of current pulses to move the domains within the shift register, the means of coding and decoding data in the magnetic shift register, etc. In one embodiment the control circuit is fabricated using CMOS processes on a silicon wafer. The magnetic shift registers will be designed to have a small footprint on the silicon wafer so as to maximize the storage capacity of the memory device while utilizing the smallest area of silicon to keep the lowest possible cost.

In the embodiment shown in FIG. 1, the footprint of the shift register will be determined largely by the area of the wafer occupied by the reading and writing devices. Thus, the magnetic shift register will be comprised of tracks extending largely in the direction out of the plane of the wafer. The length of the tracks in the vertical direction will determine the storage capacity of the shift register. Since the vertical extent can be much greater than the extent of the track in the horizontal direction, hundreds of magnetic bits can be stored in the shift register yet the area occupied by the shift register in the horizontal plane is very small. Thus, the shift register can store many more bits for the same area of silicon wafer as compared to conventional solid state memories.

Although the tracks of the magnetic shift register are shown as being largely orthogonal to the plane of the reading and writing elements (the circuitry plane) these tracks can also be inclined, at an angle, to this reference plane, as an example, for the purpose of greater density or for ease of fabrication of these devices.

Figure 3:
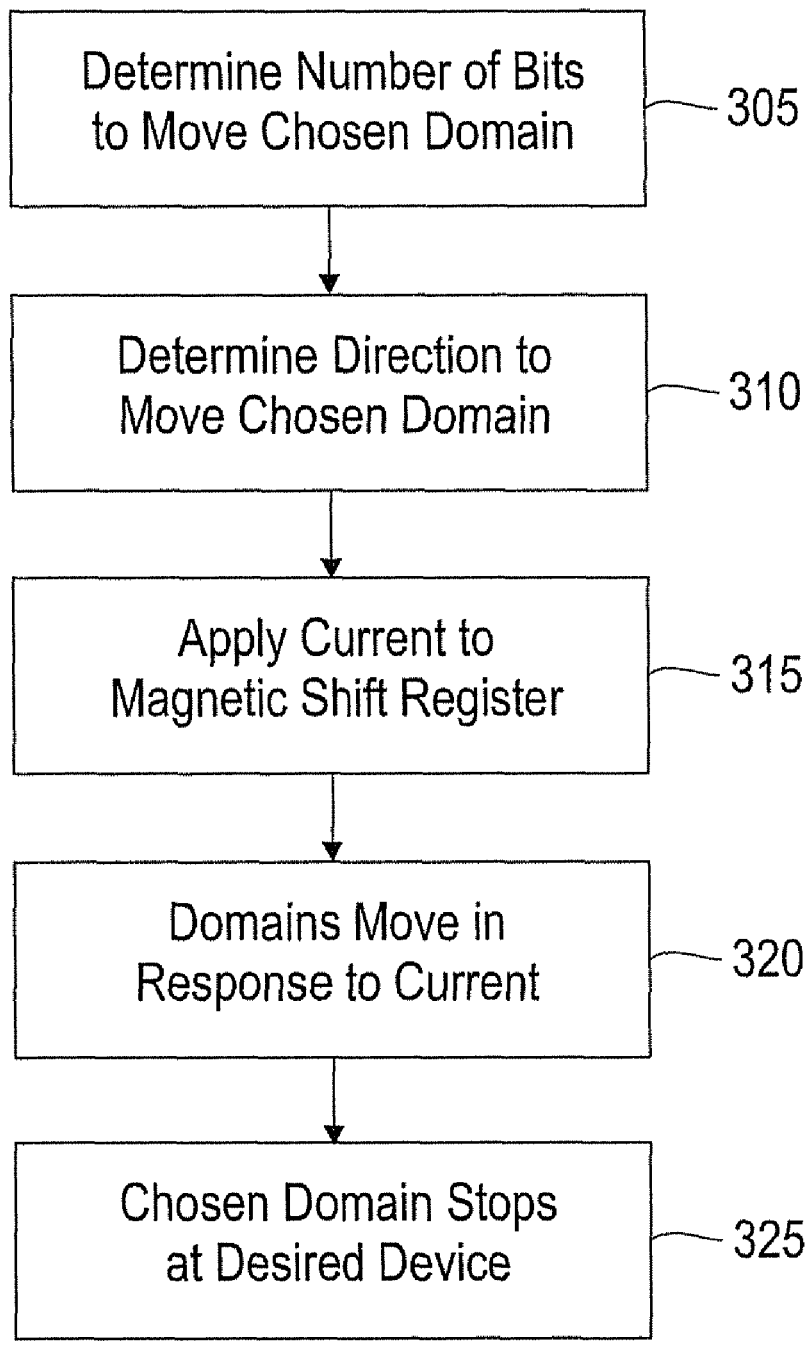
FIG. 3 is a process flow chart illustrating a method of operation of the magnetic shift register of FIG. 1.

A method 300 of operating the magnetic shift register 10 is illustrated in FIG. 3, with further reference to FIG. 2 (FIGS. 2A, 2B, and 2C). For illustration purpose, a memory system 100 utilizing the magnetic shift register 10 wishes to either read the data in domain 25 or write data to domain 25 (refer to FIG. 2A).

At block 305, the memory system 100 determines the number of bits required to move domain 25 to either the writing device 15 or reading device 20. The memory system 100 also determines the direction required to move domain 25 in bock 310. In FIG. 2A, domain 25 is on the left of the writing device 15 and the reading device 20. A positive current 45 might be required to move domain 25 to the right, for example, while a negative current 45 might be required to move domain 25 to the left.

The memory system 100 then applies the desired current 45 to the magnetic shift register 10 at block 315. Current 45 may be one pulse or a series of pulses, moving the domain 25 one bit at a time. It is also possible to vary the length of duration or the amplitude of the current within the pulse or the pulse shape (current versus time within the pulse), to cause the domain 25 within the storage region 35 to move by several increments during the application of one pulse. The domains in the data region 35 move in response to the current 45 in block 320. Domain 25 stops at the desired device, i.e., writing device 15 or reading device 20 (block 325).

Figure 4:
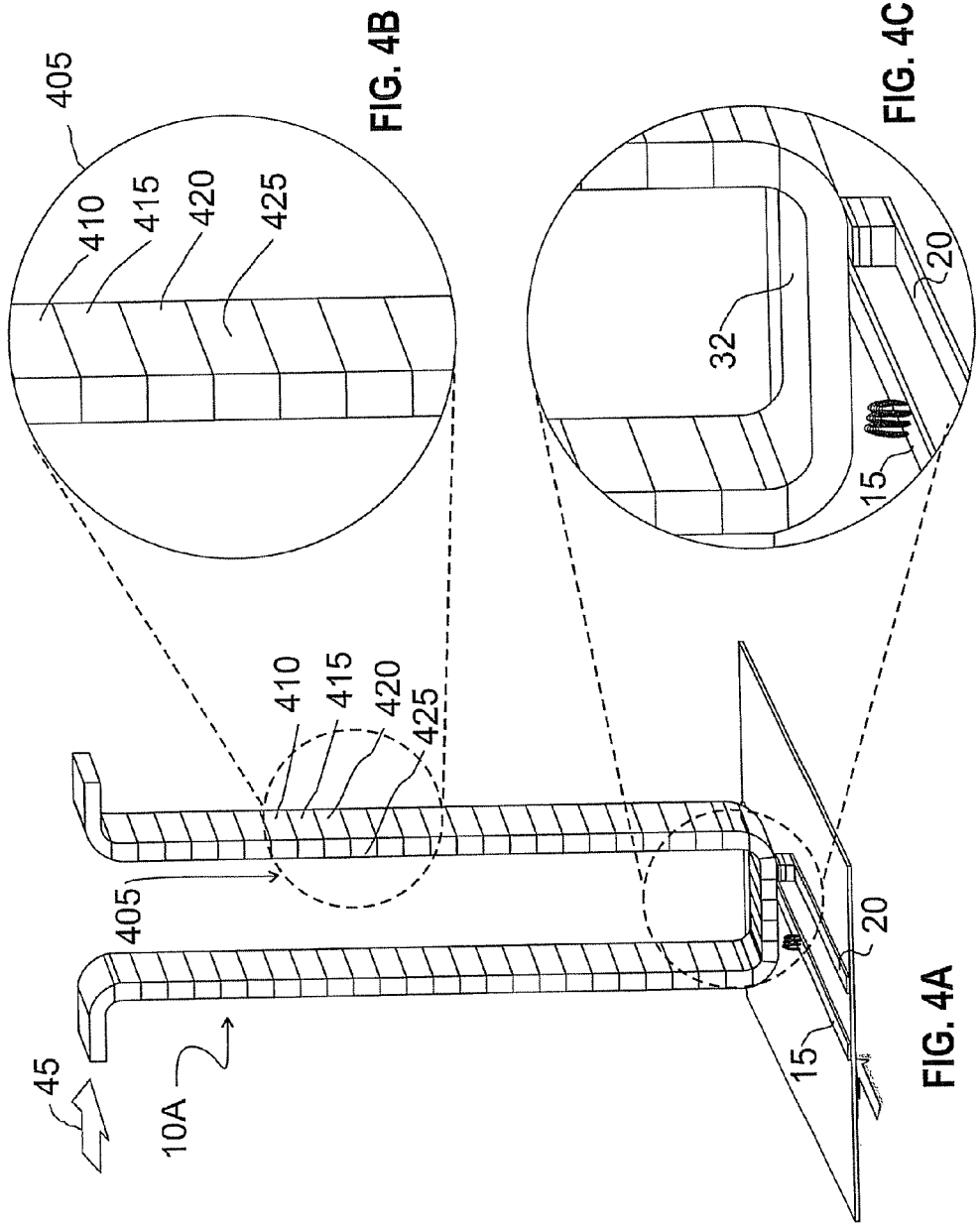
FIG. 4 is comprised of FIGS. 4A and 4B, and represents a schematic diagram illustrating an embodiment of the magnetic shift register of FIG. 1 constructed of multiple types of alternating ferromagnetic materials.

With reference to FIG. 4 (FIGS. 4A, 4B), an alternative magnetic shift register 10A may be constructed similarly to the shift register 10 of FIGS. 1 and 2, but made of alternating magnetic layers, to pin the possible locations of the domains within the magnetic shift register 10A. Pinning the possible locations of the domains prevents the designated domains from drifting.

The magnetic layers may be comprised of various ferromagnetic or ferrimagnetic materials where these magnetic materials are chosen appropriately based primarily on the magnitude of their magnetization (magnetic moment per unit volume), exchange parameter, magnetic anisotropy, and damping coefficient. The choice of these materials will also be influenced by their manufacturability and compatibility with the process used to fabricate the magnetic shift register.

As shown in region 405 of the shift register 10A, one type of magnetic material may be used for domains 410, 420, while a different type of magnetic material may be used for alternating domains 415, 425. In another embodiment, multiple types of magnetic materials may be used, in varying order of materials.

The introduction of different ferromagnetic layers in the magnetic shift register 10A creates local energy minima, similar to "potential wells", so that the domain walls between domains of opposite polarity will align themselves with the boundaries between the alternating ferromagnetic layers 410, 415, etc. Thus, the extent and size of the domains will be determined by the thicknesses of the magnetic layers.

A current pulse 45 applied to the magnetic shift register 10A causes the domains 410-425 within the region 405 to move in the direction of the current 45. However, unless the current pulse 45 is of sufficient amplitude and duration, the domains 410-425 may not move past the boundaries between the two different types of magnetic material. Consequently, the data region 35 can be moved one bit at a time, and the domains are not allowed to drift past their desired positions.

In addition to pinning the possible locations of the domains, using different layers of magnetic material also allows higher tolerances for current amplitude and pulse duration. In this embodiment, the portion of the magnetic shift register 10A that passes over the writing device 15 and the reading device 20 can be a homogeneous magnetic material or layers of different magnetic materials as illustrated in FIG. 4C.

The length of the alternating magnetic regions 410, 420, etc. and 415, 425 etc. can be different. Moreover, although it may be preferred that the length of each type of magnetic region 410, 420, etc., and 415, 425, etc. be the same throughout the shift register, this is not essential, and these lengths can vary somewhat throughout the magnetic shift register. What is important is the potential that pins the domains in their defined positions against current induced motion induced by the current pulses.

2. Analytical Model

An analytical model used by the present invention is based upon a one-dimensional model of domain walls, which includes the effect of spin-polarized currents flowing across the domain wall. These spin-polarized currents exert torques on the magnetization.

Figure 5:
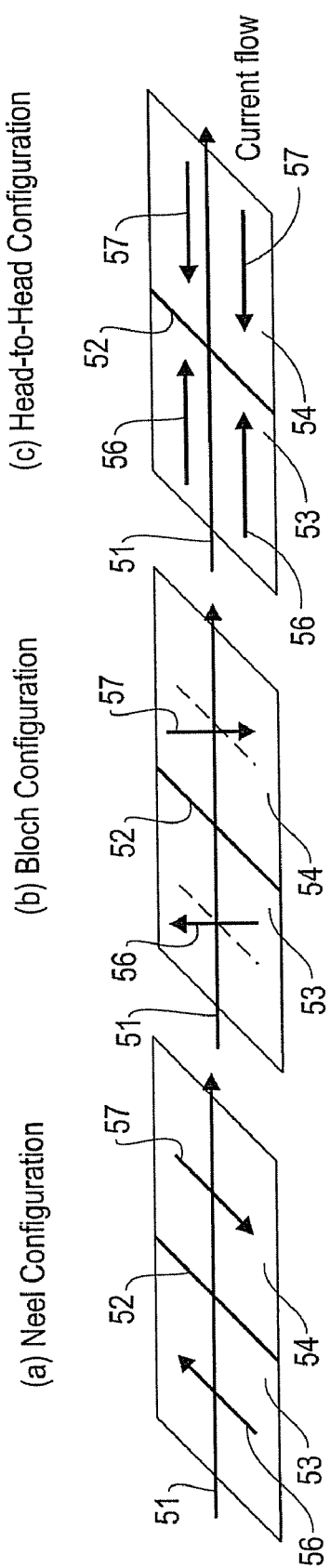
FIG. 5 depicts different configurations for domain walls such that electrical current is flowing along a nanowire, in accordance with embodiments of the present invention.

FIG. 5 depicts different configurations for domain walls such that electrical current is flowing along a nanowire in a direction 51 (x direction), in accordance with embodiments of the present invention. In FIG. 5, the magnetization directions 56 and 57 of two neighboring magnetic domains 53 and 54, respectively, are separated by a magnetic domain wall 52 across which the magnetization rotates from one direction 56 to the other 57. In FIG. 5, the magnetization directions 56 and 57 are shown schematically for: (a) a Néel wall configuration; (b) a Bloch wall configuration; and (c) a head-to-head wall configuration. In FIG. 5 the cross-section of the nanowire is such that the nanowire is wider in the direction y within the plane shown in FIG. 5 (and perpendicular to the current direction x) and thinner in the direction z perpendicular to the plane illustrated in FIG. 5.

Figure 6A:
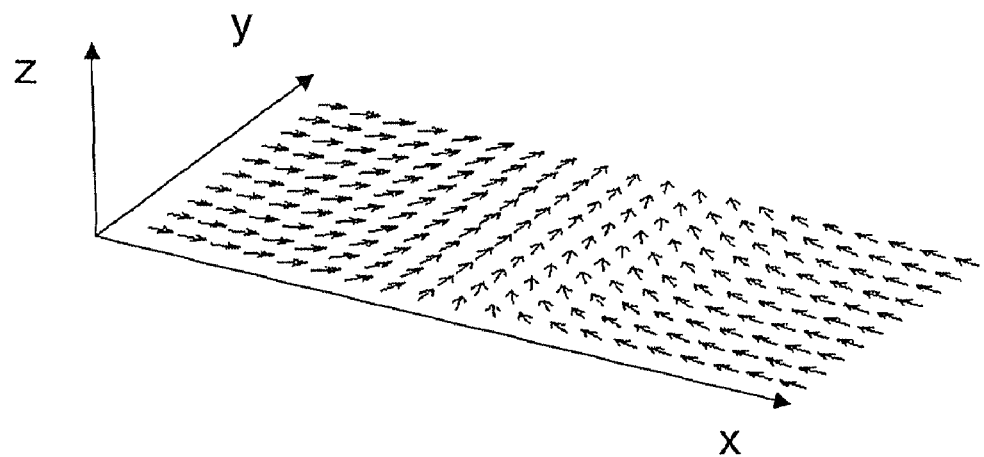
FIG. 6A depicts a magnetization profile for a head-to-head transverse wall showing the definition of the x, y, and z axes of a rectangular coordinate system, in accordance with embodiments of the present invention.
Figure 6B:
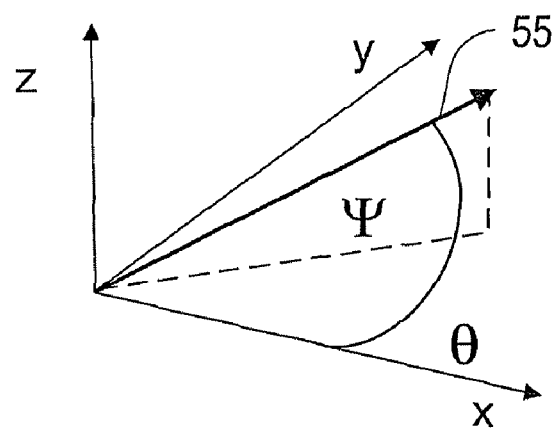
FIG. 6B illustrates a definition of the azimuthal angle $\theta$ and the tilt angle $\Psi$ in spherical coordinates for describing the direction of the magnetization vector, in accordance with embodiments of the present invention.

FIG. 6A depicts a magnetization profile for a head-to-head transverse wall showing the definition of the x, y, and z axes of a rectangular coordinate system, in accordance with embodiments of the present invention. FIG. 6B illustrates a definition of the azimuthal angle $\theta$ and the tilt angle $\Psi$ for describing the magnetization direction 55 in spherical coordinates, in accordance with embodiments of the present invention. The nanowire's long axis is along the x axis and the nanowire is in the (x,y) plane.

2.1 One-Dimensional Model

A one-dimensional model assumes a particular form of the configuration of the magnetization directions within a domain wall. In the one-dimensional model the magnetization direction only varies along one direction, namely the direction x. In a quiescent state, in which there is an absence of any corresponding spin torque of perturbation (e.g., there is no electrical current along the nanowire and no external magnetic field), the angles θ and Ψ characterizing the magnetization direction 55 within the domain wall are described by Equations (1A) and (1B):

$$\theta(x) = \pm 2 \arctan(e^{(x-q)/\Delta}) \quad (1A)$$

$$\Psi(x) = C \quad (1B)$$

wherein q(t) is the position of the domain wall center along x as a function of time, Ψ(x) is the tilt angle of the domain wall magnetization away from its equilibrium position as a function of x, and Δ is the domain wall width parameter. C is a constant whose value is zero for a Bloch wall and a Head to Head transverse wall and is π/2 for a Néel wall. In the following discussion only the case of the Head to Head wall is considered in detail.

Note that Equations (1A) and (1B) are exact for the one-dimensional Bloch wall configuration (b) of FIG. 5. The one-dimensional model also provides a good description of the Néel wall configuration (a) and the head-to-head transverse wall configuration (c) of FIG. 5. Qualitative agreement is also obtained for more complex domain wall configurations (for example, the head-to-head vortex wall).

The domain wall width parameter for a transverse wall is written as:

$$\Delta = \Delta_0 \Big/ \sqrt{1 + \frac{K}{K_0} \sin^2(\Psi)} \quad (2)$$

$$\Delta_0 = \sqrt{\frac{A}{K_0}}$$

wherein A is the exchange constant (which is ~$10^{-6}$ erg/cm for permalloy) and $K_0$ is the magnitude of the uniaxial anisotropy, and K is the magnitude of the transverse anisotropy.

The uniaxial anisotropy $K_0$ defines the easy direction of magnetization in the nanowire and, thereby, the preferred direction of the magnetization within the magnetic domains, wherein the magnetization direction is parallel to the wire long axis in the case of head-to-head domain walls (see (c) in FIG. 5), in-plane perpendicular to the wire long axis in the Neel geometry (see (a) in FIG. 5), and perpendicular to the nanowire plane in the Bloch geometry (see (b) in FIG. 5).

In the head-to-head configuration, the transverse anisotropy K is located in the plane of the wire perpendicular to the wire long axis. The magnitude of the transverse anisotropy K can also be written as an anisotropy field $H_k = 2K/M_S$, where $M_S$ is the saturation magnetization of the material. For soft magnetic materials (for example, permalloy) and in the case of a transverse wall in the head-to-head configuration, the transverse anisotropy K is related to the aspect ratio of the cross-section of the nanowire.

For simplicity, it is assumed herein that $K_0 \gg K$, such that the domain wall width parameter is essentially constant throughout the motion of the domain wall.

2.2 Pinning of the Domain Wall and External Field

A parabolic pinning potential describes the experimental pinning of the domain wall in nanowires. The pinning can be either a weak pinning associated with random defects and edge roughness, or a stronger pinning at a lithographically designed pinning site (e.g., notch, hump, step, etc.) or in a nanowire formed of alternating magnetic materials. The case of random defects within the interior or at the edges or surfaces of the nanowire may especially be the case for a nanowire formed from a homogeneous magnetic material with no engineered defects or pinning sites. The parabolic pinning potential σ(q) is defined as follows:

$$\sigma(q) = Vq_0(q/q_0)^2 \text{ for } |q| < q_0 \quad (3)$$

$$\sigma(q) = Vq_0 \text{ for } |q| > q_0$$

wherein σ is the potential energy of the domain wall per unit surface area (erg/cm²), V is the depth of the potential (dimension of an energy density erg/cm³), and $q_0$ is the spatial extension of the potential. The position q corresponds to the position of the center of the domain wall relative to the center of the pinning potential. Thus q=0 corresponds to the center of the pinning potential.

Figure 7:
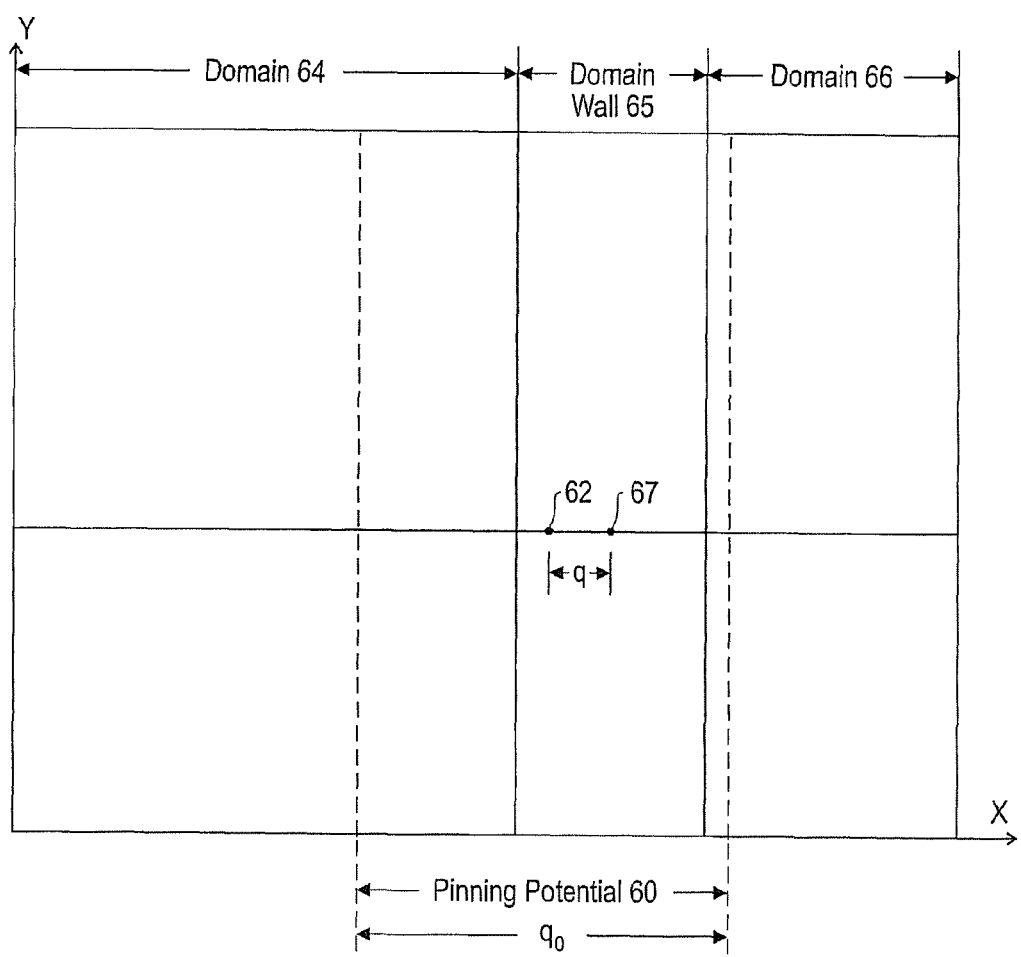
FIG. 7 illustrates the geometric notation that characterizes the domain wall and the pinning potential, in accordance with embodiments of the present invention.

FIG. 7 illustrates the geometric notation that characterizes the domain wall and the pinning potential, in accordance with embodiments of the present invention. In FIG. 7, domain wall 65 is disposed between domains 64 and 66. The pinning potential 60 extends over a length of scale $q_0$. The center 67 of the domain wall 65 has a position q relative to the center 62 of the pinning potential 60. FIG. 7 depicts the embodiment of $|q| < q_0$ in Equations (3).

Note that $q_0$ is not the physical size of the pinning feature, but rather is the extension of the potential well which reflects both the size of the feature (e.g., notch) and the width of the domain wall.

Magnetic fields applied along the nanowire (parallel to the direction of the magnetization in the domains for the head to head domain wall configuration) exert a pressure on the domain wall which can be included in the domain wall potential energy. In the presence of such an applied magnetic field H, the contribution to the domain wall potential energy is $-2M_S Hq$.

2.3 Equations of Motion

Within the framework of the one-dimensional approximation, the dynamics of the domain wall can be described by the two variables q(t) and Ψ(t). The equations of motion for q(t) and Ψ(t) are as follows:

$$(1+\alpha^2)\dot{q} = -\frac{\alpha\gamma\Delta}{2M_S}\left(\frac{\partial\sigma}{\partial q}\right) + \frac{\gamma\Delta}{2}H_k\sin(2\Psi) + (1+\alpha\beta)u \quad (4)$$

$$(1+\alpha^2)\dot{\Psi} = -\frac{\gamma}{2M_S}\left(\frac{\partial\sigma}{\partial q}\right) - \frac{\gamma\alpha}{2}H_k\sin(2\Psi) + \frac{(\beta-\alpha)u}{\Delta}$$

wherein α is the Gilbert damping (dimensionless), $M_s$ is the saturation magnetization of the material, and γ is the gyromagnetic ratio (17.6 MHz/Oe). In the following calculations and simulations, the value of $M_s$ for permalloy (800 emu/cm³) is used.

The influence of current on the domain wall dynamics is characterized by the two parameters u (dimension of a velocity, m/s) and β (dimensionless).

The parameter u is the magnitude of the spin-transfer torque which is proportional to the current density J in the nanowire and is derived from the conservation of the spin angular momentum. The parameter u is written:

$$u = g\mu_B JP/2eM_S \quad (5)$$

wherein g is the Lande factor (~2), J is the current density, P is the spin-polarization of the current, $\mu_B$ is the Bohr magneton (0.927×10$^{-20}$ emu), and e is the electron charge (1.6× 10$^{-19}$ C).

The spin polarization P may be less than 1 and depends on the material. Using a value of P=0.4 for permalloy in Equation (5), the ratio of current density J to the spin torque amplitude u is about 3.5 10$^6$ A/cm$^2$ to 1 m/s. Also note that in some models, the polarization P is replaced by the Slonczewski function g(P) in Equation (5), in which case the ratio of the current density J to the spin torque amplitude is about 2.4 10$^6$ A/cm$^2$ for 1 m/s. See J. C. Slonczewski, J. Magn. Magn Mater. 159, L1 (1996) for a discussion of the Slonczewski function g(P).

The discussion infra of current density J and associated numerical results is expressed under a convention that a unit current flow area of 1 cm$^2$ is used, so that 1 ampere ("A") of electrical current through an area of 1 cm$^2$ corresponds to 1 A/cm$^2$ of current density. In the following, references to "current" refer to current flowing through a nanowire with an area A so that the current density would be the current divided by the area A. Thus in the discussions infra, in light of the fact that spin torque u is related to current density J via Equation (5), indications of electrical current expressed in units of m/sec refer to an electrical current density J that induces a spin torque u of the expressed units of m/sec in the ferromagnetic material normalized, independent of the cross-sectional area, for the same current density J.

The parameter $\beta$ in Equation (5) characterizes a force on the domain wall which may be exerted by the spin-polarized current in addition to the spin-transfer torque. The magnitude of $\beta$ is of the order of the Gilbert damping constant $\alpha$. See the following references for discussions of the origin and magnitude of $\beta$: Gen Tatara and Hiroshi Kohno, Phys. Rev. Lett. 92, 086601 (2004); A. Thiaville, Y. Nakatani, J. Miltat and Y. Suzuki, Europhys. Lett., 69, 990 (2005); S. E. Barnes and S. Maekawa, Phys. Rev. Lett. 95, 107204 (2005); and S. Zhang and Z. Li, Phys. Rev. Lett. 93, 127204 (2004).

Figure 8A:
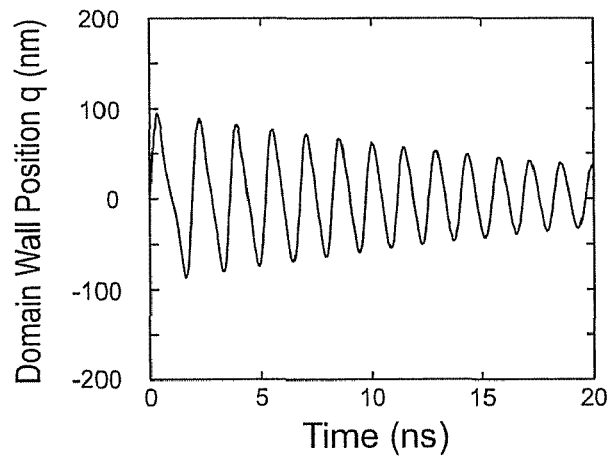
FIGS. 8A-8C depict precessional motion of a domain wall within a potential well for a current of amplitude corresponding to a spin torque of 510 m/s, in accordance with embodiments of the present invention.
Figure 8B:
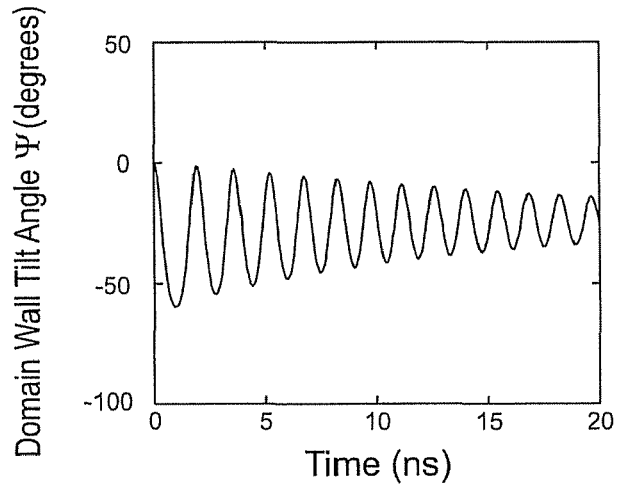
Figure 8C:
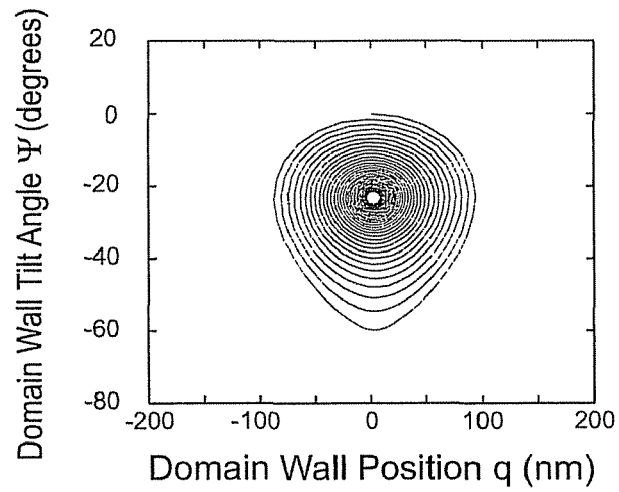

3. Quantitative Results from Use of the Analytical Model 3.1 Current-Driven Precessional Motion of Domain Wall Trapped in Parabolic Potential A domain wall submitted to a current below the threshold current for depinning undergoes a precessional motion within the potential well. FIGS. 8A-8C (collectively "FIG. 8") depict such precession in terms of the domain wall position q versus time (FIG. 8A), domain wall tilt angle $\Psi$ versus time (FIG. 8B), and the phase space (q,$\Psi$) (FIG. 8C), in accordance with embodiments of the present invention. In FIG. 8, the domain wall precession is driven by an electrical current corresponding to a spin torque u of 510 m/s (just below the critical current), calculated numerically using the one dimensional model of Equations (4). The parameters of the calculations are $\Delta$=100 nm, $H_k$=800 Oe, V=10$^5$ erg/cm$^3$, $q_0$=100 nm, $\alpha$=0.01, $\beta$=0.01 and H=0.

The period ($t_{osc}$) of the precessional motion of the domain wall can be derived analytically in the zero-damping limit by linearizing Equations (4) for small amplitude oscillations and using the parabolic pinning potential of Equation (3), resulting in Equation (6):

$$t_{osc} = 2\pi/\gamma (M_S q_0/VH_k\Delta)^{1/2} \quad (6)$$

Generally the precession period is a function of $\partial\sigma/\partial q$ and may therefore vary dynamically with spatial position of the domain wall. For high amplitude oscillations (i.e., nonlinear oscillations), the precession period increases slightly with current.

As shown in FIG. 8, the amplitude of the oscillations is damped by the Gilbert damping. Therefore, the maximum amplitude of motion (both in q and $\Psi$) is reached at short times during the first orbit of the precession, which can be seen in FIG. 8C wherein the domain wall trajectory is plotted in the phase space (q,$\Psi$).

Current-driven depinning occurs when the domain wall trajectory exits the potential well. For long pulses or dc currents, depinning should occur during the first orbit of precession where the domain wall displacement is maximum. The dc critical current (i.e., threshold current) for depinning can be determined numerically, and can also be calculated analytically in the zero-damping limit. The dc threshold current for depinning in the example of FIG. 8 is determined numerically to be 516 m/s. Using analytical Equations (7)-(8) discussed infra, a slightly smaller value 507 m/s is obtained, because of the zero-damping approximation.

Figure 9A:
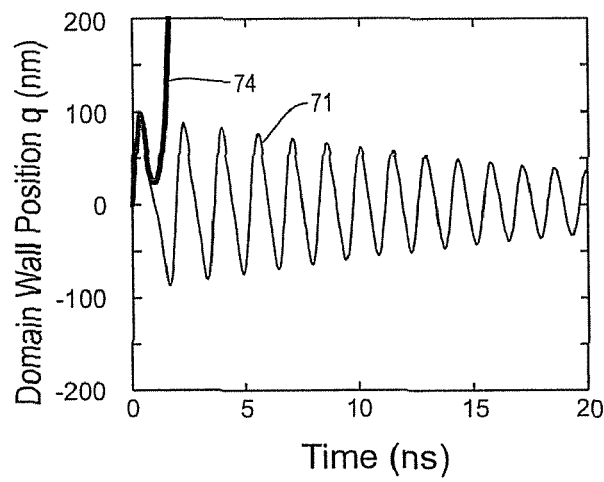
FIGS. 9A-9C depict for the same values of parameters as in FIGS. 8A-8C, precessional motion of a domain wall within a potential well for current just below (of amplitude corresponding to spin torque of 510 m/s) and above (of amplitude corresponding to spin torque of 520 m/s) the threshold current for depinning, in accordance with embodiments of the present invention.
Figure 9B:
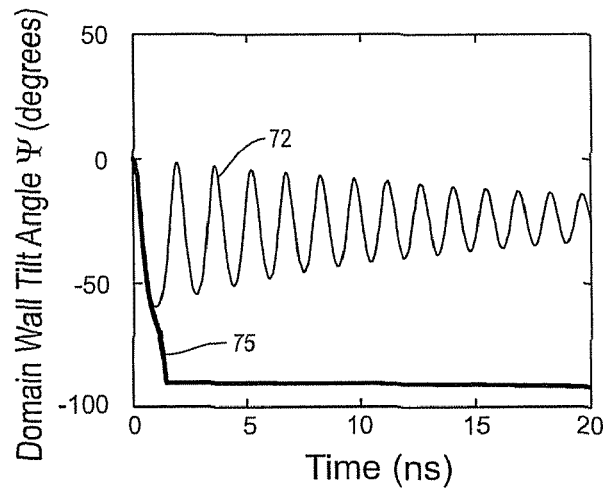
Figure 9C:
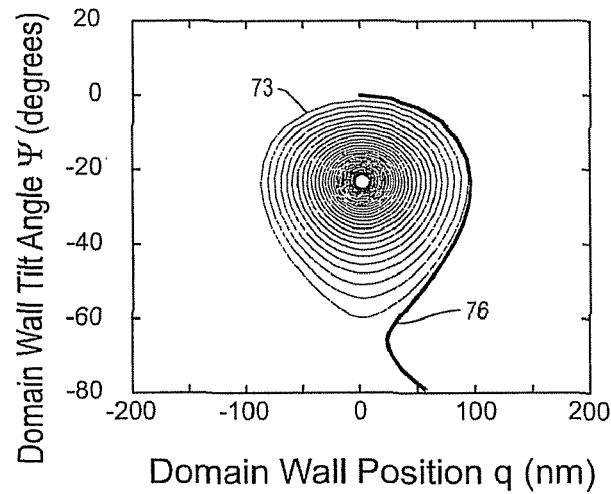

FIGS. 9A-9C (collectively "FIG. 9") depict precessional motion of a domain wall within a potential well for electrical current just below the threshold current for depinning (u=510 m/s, curves 71-73) and just above the threshold current for depinning (u=520 m/s, lines 74-76), in accordance with embodiments of the present invention. The plots in FIG. 9 are: q versus time (FIG. 9A), $\Psi$ versus time (FIG. 9B), and $\Psi$ versus q (FIG. 9C). In the example of FIG. 9, this dc critical current corresponds to a spin torque u of 520 m/s. In FIG. 9, the parameters of $\Delta$, $H_k$, V, $q_0$, $\alpha$, $\beta$, and H have the same numerical values as in FIG. 8 and the plots for current just below the threshold current are the same as in FIG. 8.

The dc threshold current for domain wall motion has been determined analytically in the zero damping limit and the following two different mechanisms for depinning are utilized in the present invention, for which the threshold currents are written as:

$$u_{c1} = \gamma (VH_k \Delta q_0/M_S)^{1/2} \quad (7)$$

$$u_{c2} \sim 0.36 \gamma H_k \Delta \quad (8)$$

The actual threshold current is the smallest of $u_{c1}$ and $u_{c2}$. These expressions in Equations (7) and (8) correspond to the threshold depinning current for two different regimes of depinning, field-like (when the domain wall position q exceeds the pinning potential width $q_0$ during the domain wall's oscillatory trajectory) and current-like (when $\Psi$ exceeds the bifurcation point; i.e. when $\Psi$ exceeds a critical value such that the domain wall's trajectory no longer follows an oscillatory path) and are derived for the zero-field case without damping and for $\beta$=0.

Sections 3.2-3.4 describe the effect of current pulses on the threshold current for depinning. The rise and fall times of the current pulses are each assumed to be less than about 25% of the domain wall precession period.

3.2. Current Pulses: Inertia Driven Depinning.

If the current amplitude is smaller than the threshold current for depinning, then during the current pulse, the domain wall undergoes a precessional motion in accordance with Equations (4). When the current is turned off, this precession continues as the domain wall precesses towards its equilibrium state without current. Depending upon the length of the current pulse and the position of the domain wall in the (q,$\Psi$) phase space when the current is turned off, the amplitude of the domain wall oscillations after the end of the current pulse can increase, leading to depinning of the domain wall after the current is turned off. The amplitude of the domain wall oscillations, after the end of the current pulse, is maximum when the current pulse length is about half the domain wall precession period for the case of a current pulse shorter than the precessional period of the domain wall. For current pulses longer than the precessional period of the domain wall, the amplitude of the domain wall oscillation after the end of the current pulse is maximized when the current pulse length is equal to an integer number of oscillation periods plus about half an oscillation period.

Figure 10A:
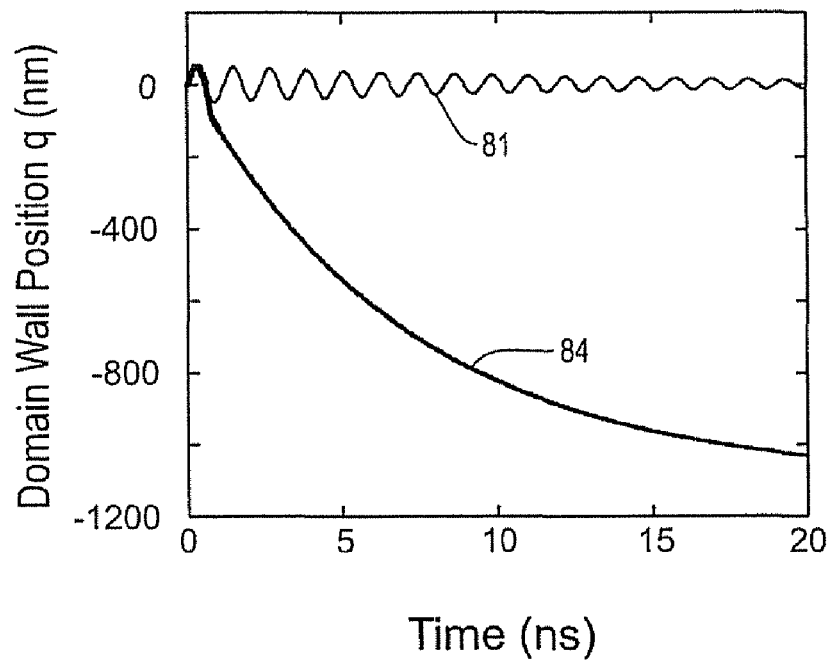
FIGS. 10A and 10B depict for the same values of parameters as in FIGS. 8A-8C and 9A-9C, domain wall position and tilt angle versus time for a current of amplitude corresponding to a spin torque of 290 m/s, in accordance with embodiments of the present invention.
Figure 10B:
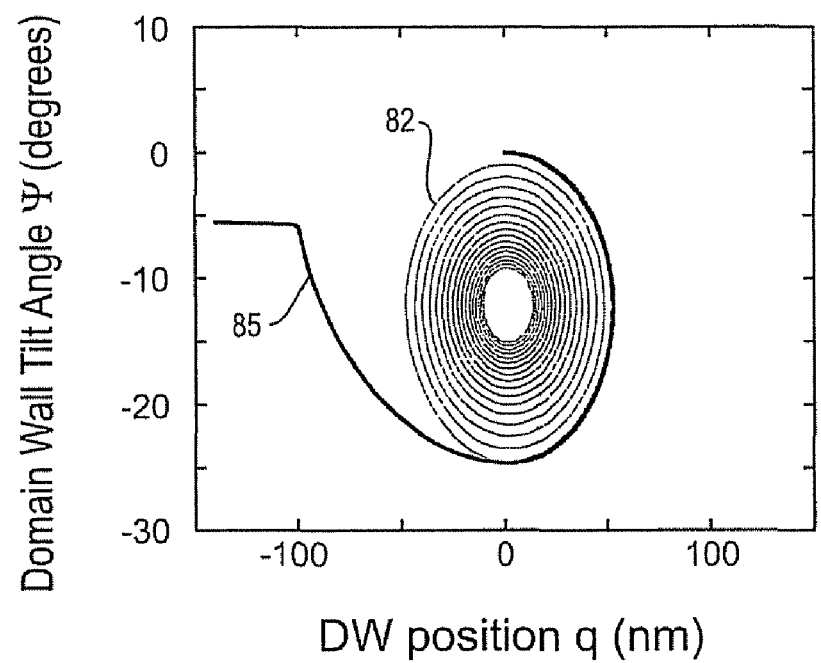

FIGS. 10A and 10B (collectively "FIG. 10") depict for the same values of parameters ($\Delta$, $H_k$, V, $q_0$, $\alpha$, $\beta$, H) as in FIGS. 8 and 9, domain wall position q versus time (FIG. 10A) and $\Psi$ versus q (FIG. 10B) for a current of amplitude corresponding to a spin torque u of 290 m/s, in the case of a dc current (curves 81-82) and a pulse current of 0.6 ns duration (curves 84-85), in accordance with embodiments of the present invention.

In the example shown in FIG. 10, the domain wall exits the potential well for a current pulse of amplitude corresponding to a spin torque u=290 m/s with a duration of 0.6 ns, whereas it stays within the potential well for a dc current of the same amplitude. The dc critical current for depinning of about 516 m/s is thus reduced by a factor of about 1.8 (i.e., 516/290) when a single current pulse is used instead of a dc current.

Note that domain wall motion can occur after several periods of precession if the domain wall momentum is large enough, leading to oscillations in the critical current as a function of current pulse length.

3.3 Series of Pulses: Resonant Depinning

Figures 11A, 11B:
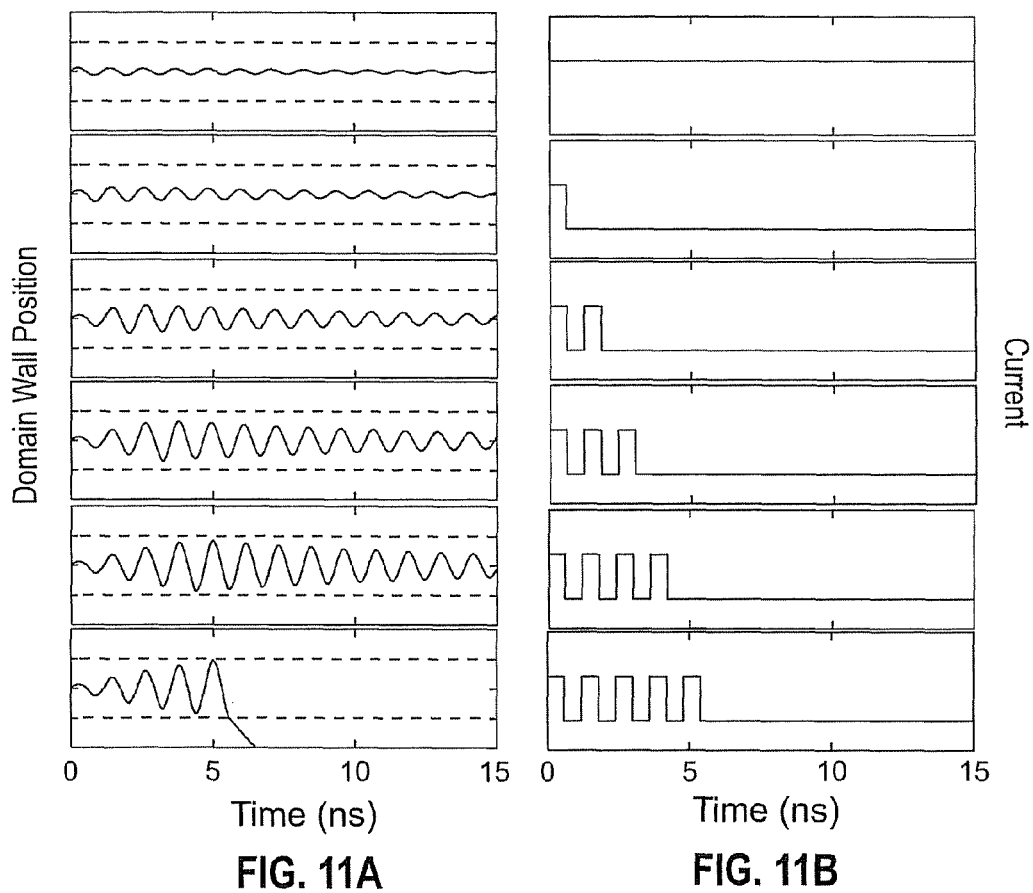
FIGS. 11A and 11B depict a comparison of the domain wall position versus time (FIG. 11A) for corresponding dc current and sequences of 1 through 5 pulses, for a pulse amplitude corresponding to a spin torque of 75 m/s (FIG. 11B), in accordance with embodiments of the present invention.

The domain wall can be driven into resonance when a series of current pulses is used. This leads to a further amplification of the domain wall oscillations after the end of the train of current pulses and, thereby, a further reduction in the critical current for depinning the domain wall. This amplification of the amplitude of the precessional oscillatory motion is illustrated in FIGS. 11A and 11B (collectively "FIG. 11") which depict a comparison of the domain wall position q versus time (FIG. 11A) for corresponding dc current and sequences of 1 through 5 current pulses (FIG. 11B), in accordance with embodiments of the present invention. In FIG. 11, the current amplitude corresponds to a spin torque u of 75 m/s (about 7 times smaller than the dc threshold current of 516 m/s). The individual pulse lengths and the time intervals between individual pulses are 0.6 ns. The dotted lines show the boundaries of the potential well (±100 nm). The calculation parameters ($\Delta$, $H_k$, V, $q_0$, $\alpha$, $\beta$, H) have the same numerical values as in FIG. 8.

The amplification of the precession leads to domain wall depinning for this current value for a sequence of 5 pulses of the same polarity, but not for the dc nor for the 1, 2, 3, and 4 pulse sequences. Both the length and the interval between the pulses is about half the precession period. The precession period is 1.2 ns.

Figure 12A:
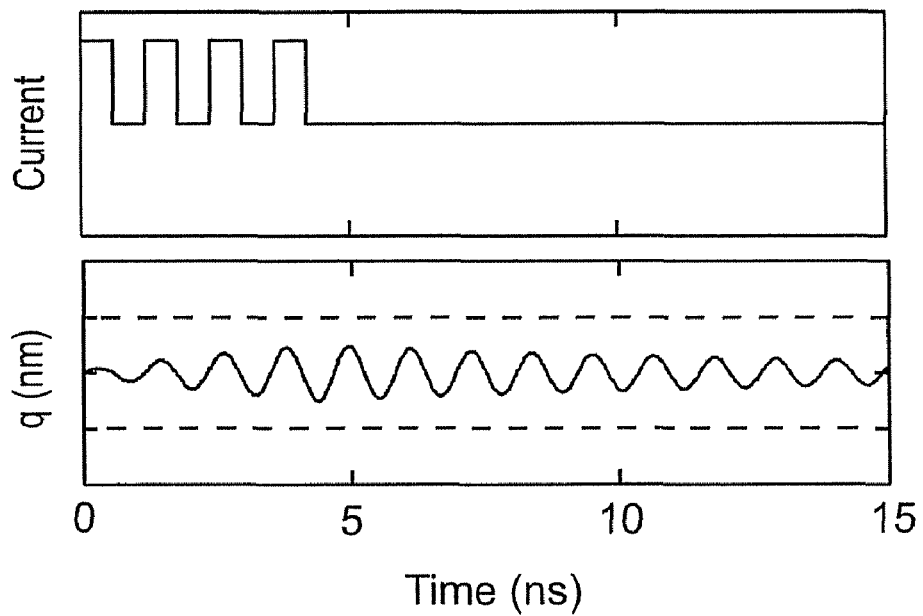
FIGS. 12A and 12B depict a comparison of the domain wall position versus time for a sequence of 4 pulses with same polarity (FIG. 12A) and 4½ bipolar pulses (FIG. 12B), with a pulse amplitude corresponding to a spin torque of 45 m/s, in accordance with embodiments of the present invention.
Figure 12B:
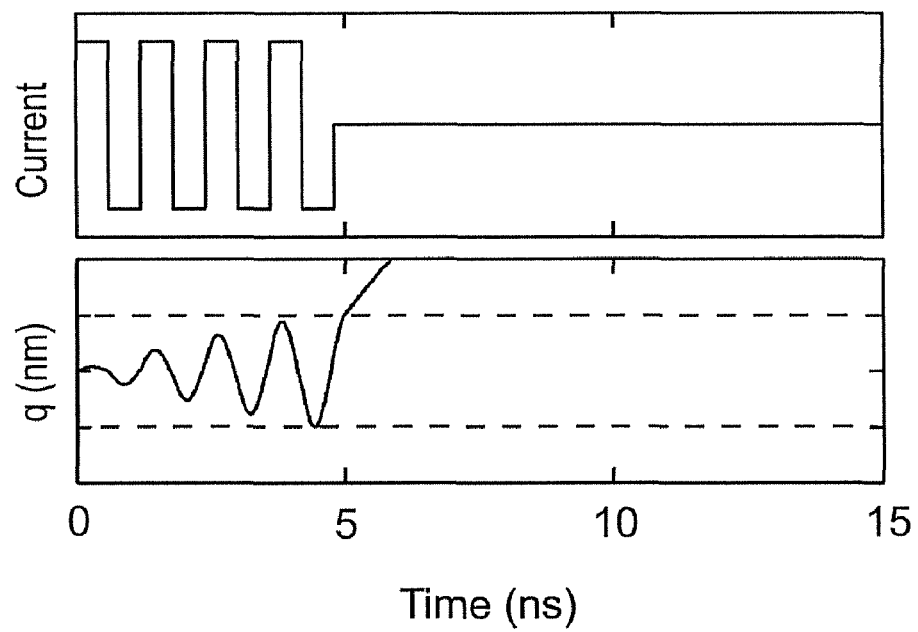

FIGS. 12A and 12B (collectively "FIG. 12") depict a comparison of the domain wall position q versus time for a sequence of 4 pulses with the same polarity (FIG. 12A) and 4½ bipolar pulses (FIG. 12B), with a current pulse amplitude corresponding to a spin torque u of 45 m/s, in accordance with embodiments of the present invention. The dotted lines show the boundaries of the potential well (±100 nm). Also shown is the current profile versus time (top panel in each of FIGS. 12A and 12B). The calculation parameters ($\Delta$, $H_k$, V, $q_0$, $\alpha$, $\beta$, H) have the same numerical values as in FIG. 8.

As shown of FIG. 12, domain wall motion is achieved for a current corresponding to a spin torque u of 45 m/s with a sequence of 4 bipolar pulses. This corresponds to a reduction by more than one order of magnitude (i.e., by more than a factor of 10) compared to the dc threshold current corresponding to a spin torque of 516 m/s. In this example, the reduction in threshold current is a factor of about 12 (i.e., 516/45).

This strong reduction of threshold current for domain wall depinning is characterized by the domain wall being driven into resonance by tuning both the length of the pulses and the interval between the pulses to be about half the precession period of the domain wall motion.

Figure 13A:
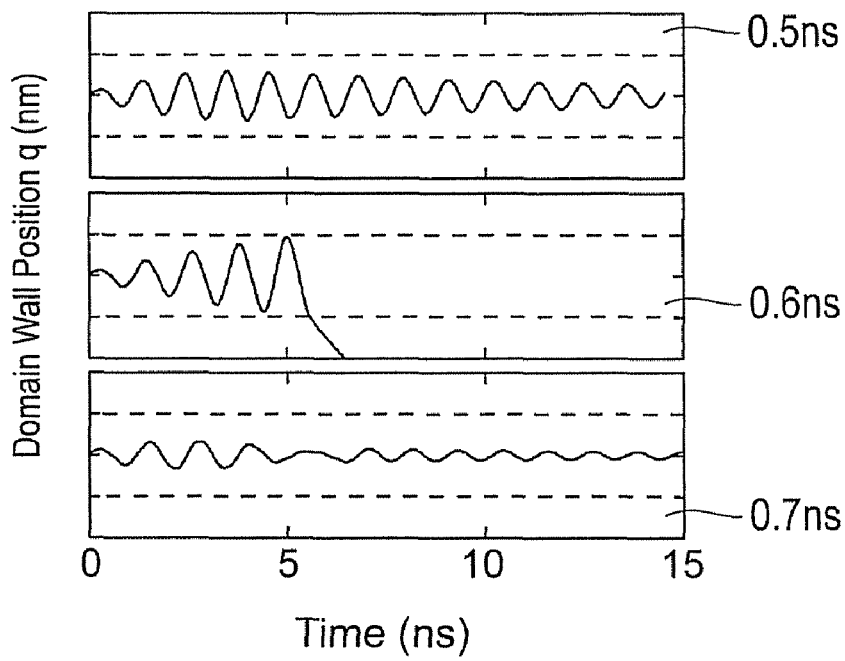
FIGS. 13A and 13B depict a comparison of the domain wall position versus time for various configurations of pulse length and pulse interval, for sequences of 5 pulses with a current amplitude corresponding to a spin torque of 75 m/s, in accordance with embodiments of the present invention.
Figure 13B:
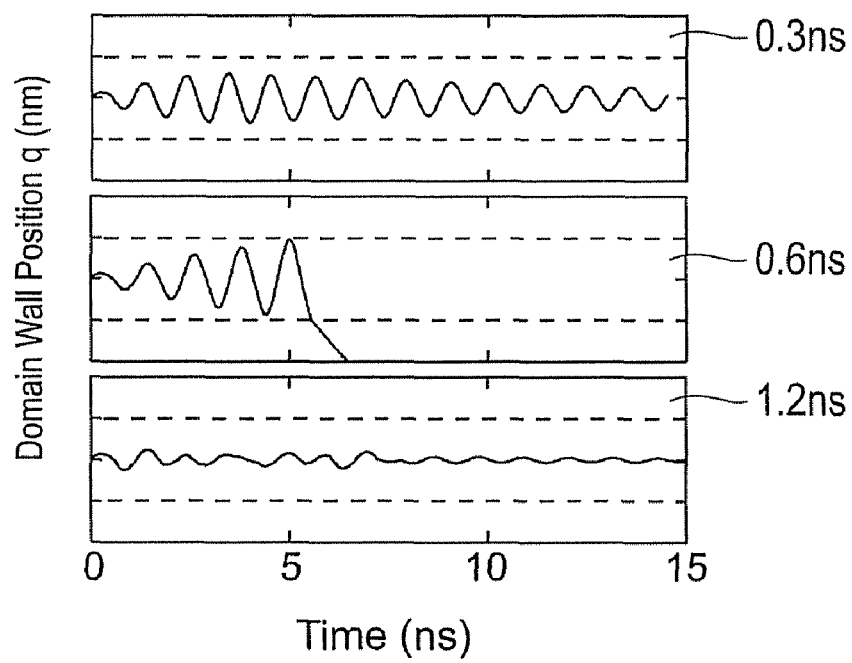
Figure 14A:
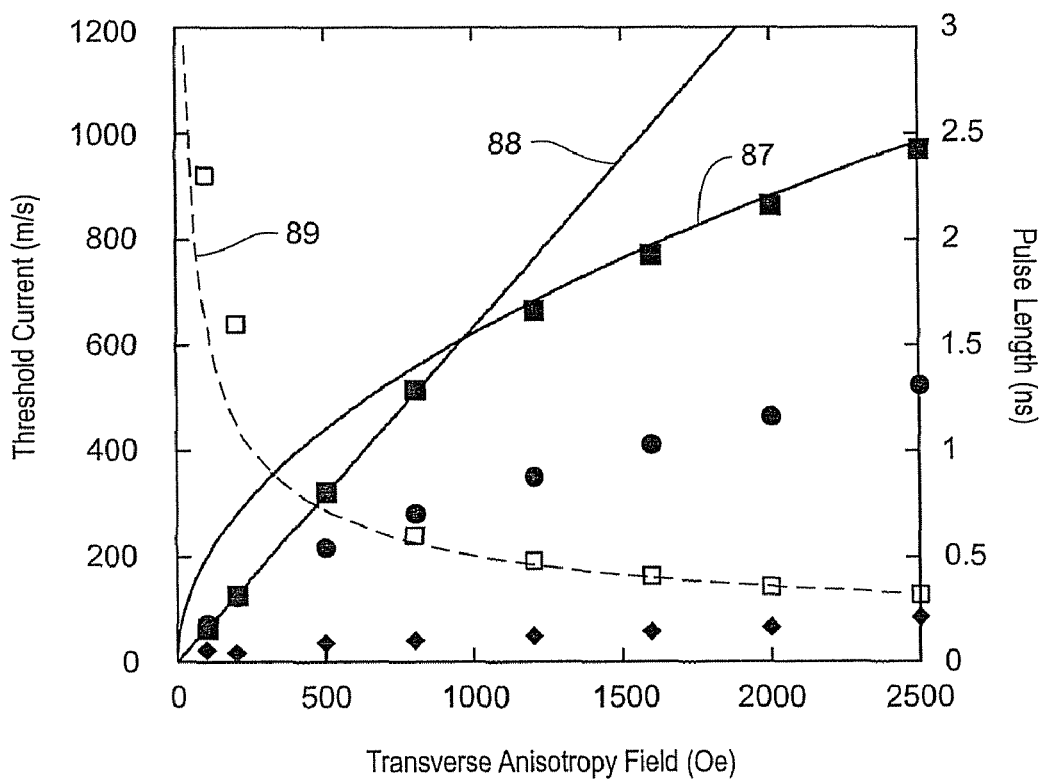
FIGS. 14-17 are plots of threshold current and reduction thereof versus various parameters, in accordance with embodiments of the present invention.
Figure 14B:
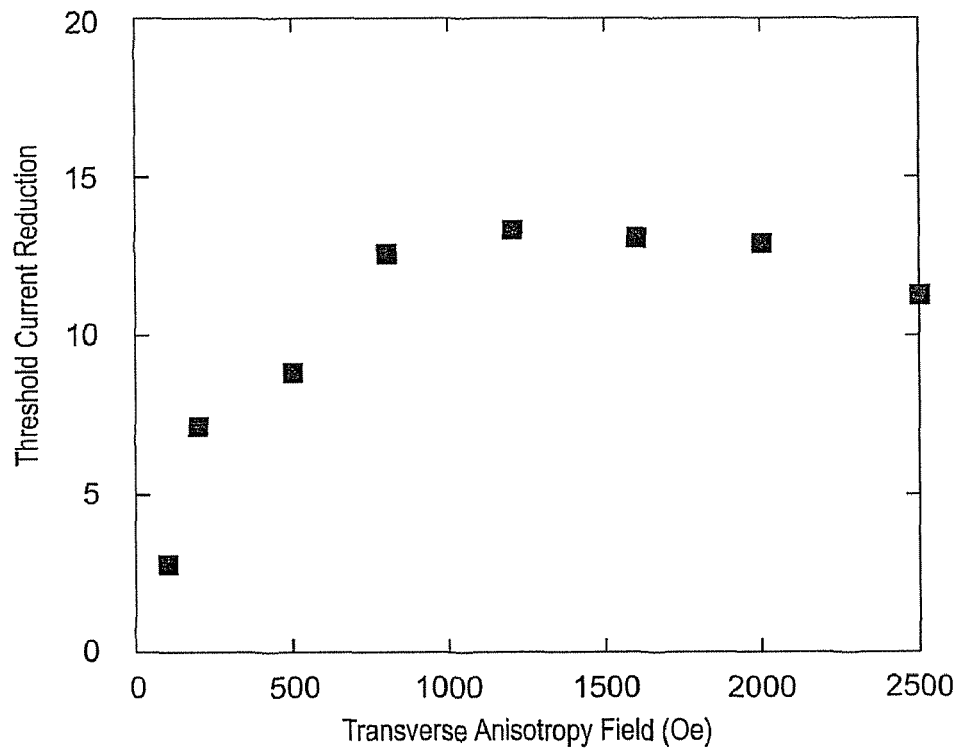
Figure 15A:
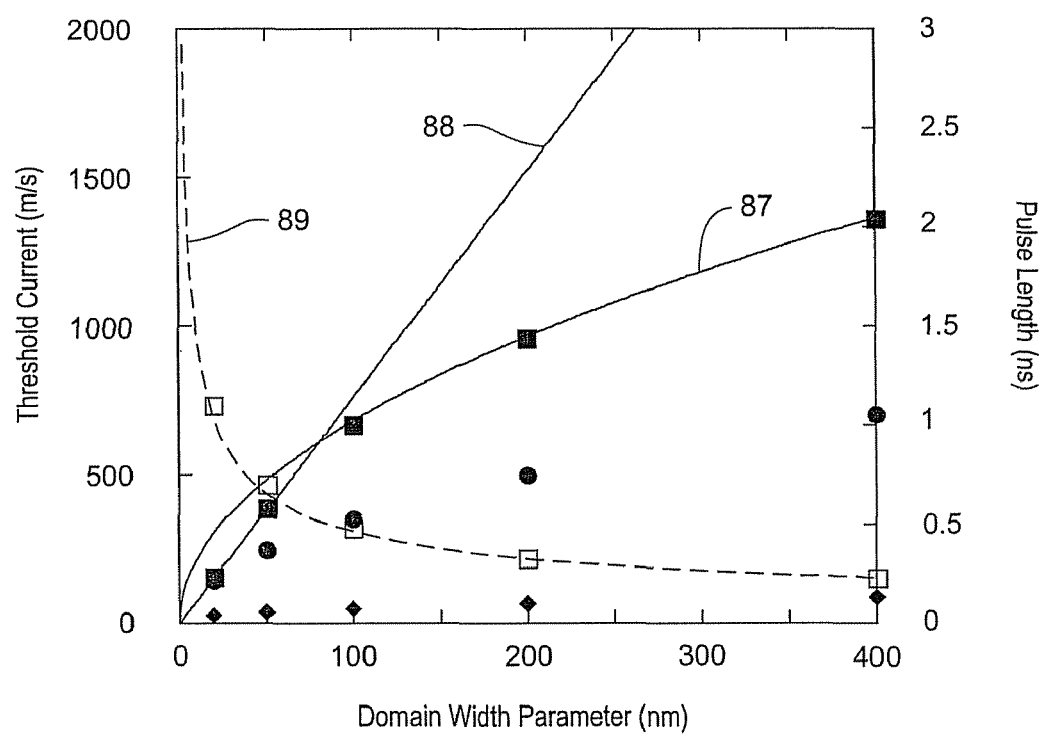
Figure 15B:
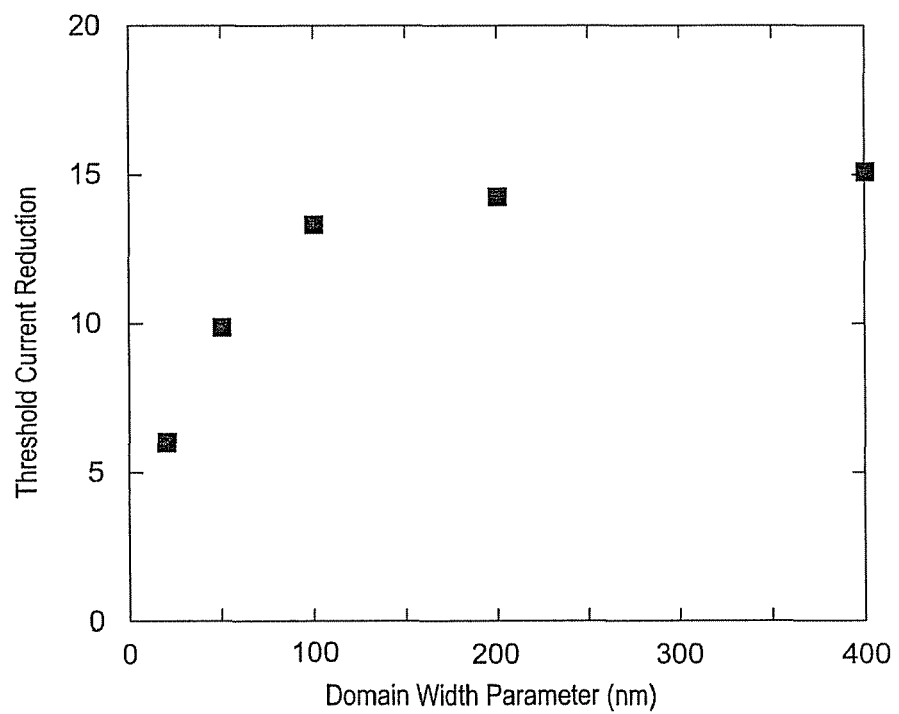
Figure 16A:
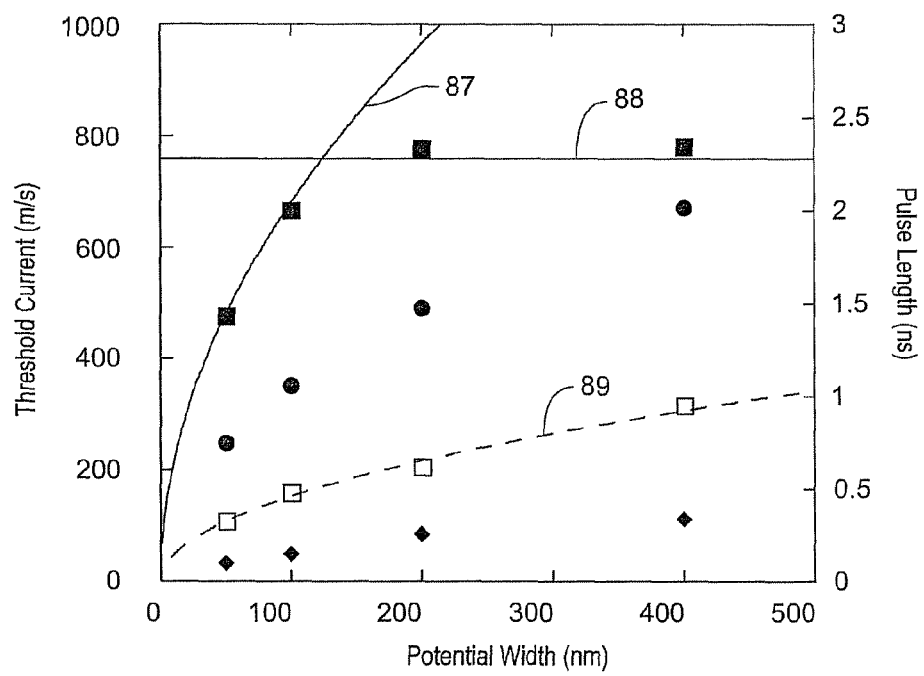
Figure 16B:
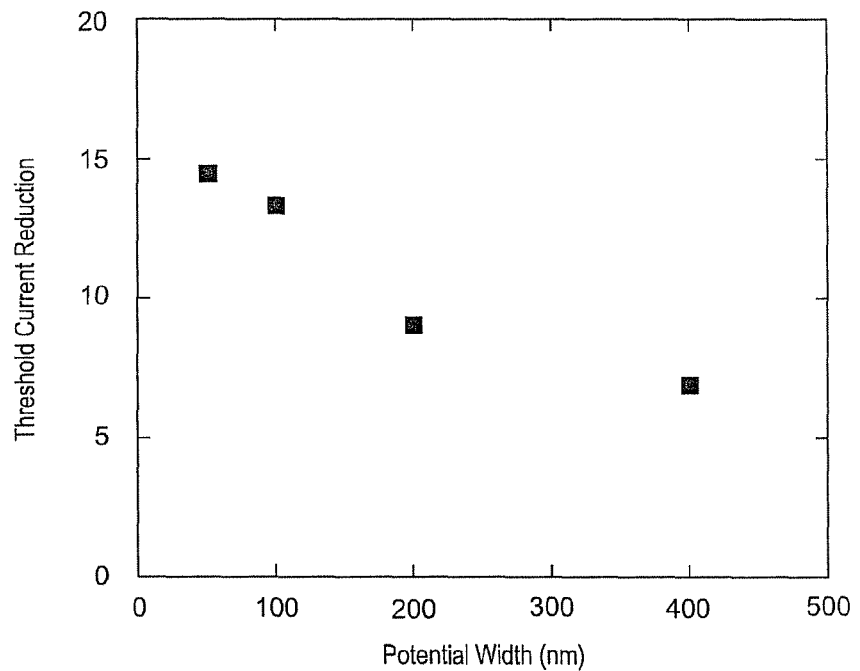
Figure 17A:
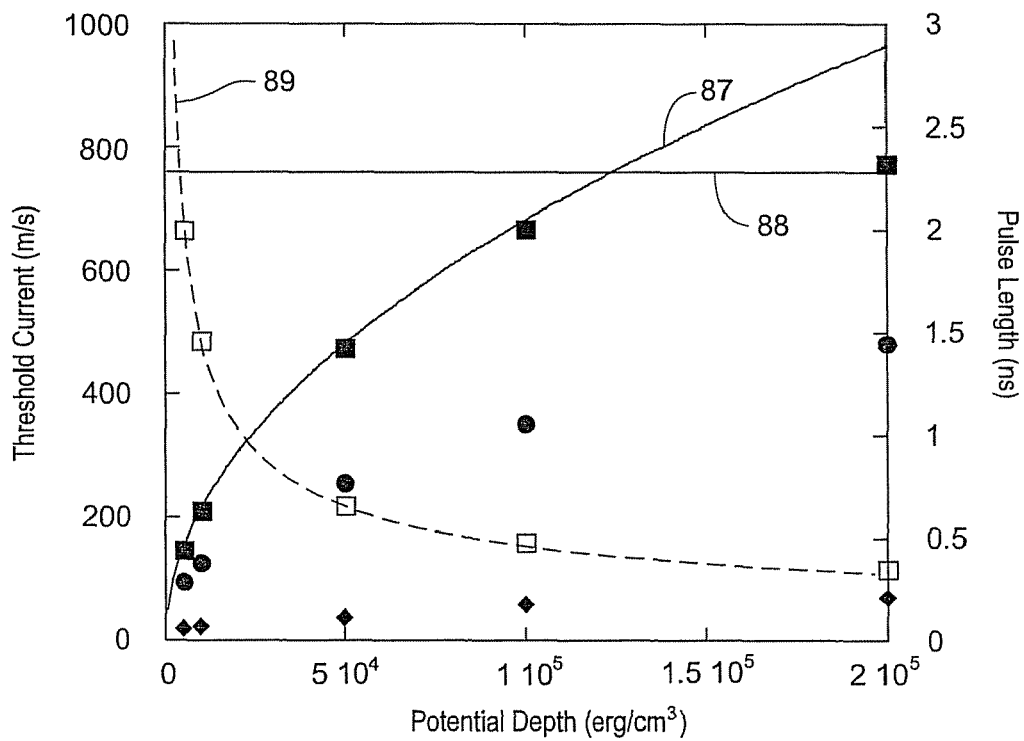
Figure 17B:
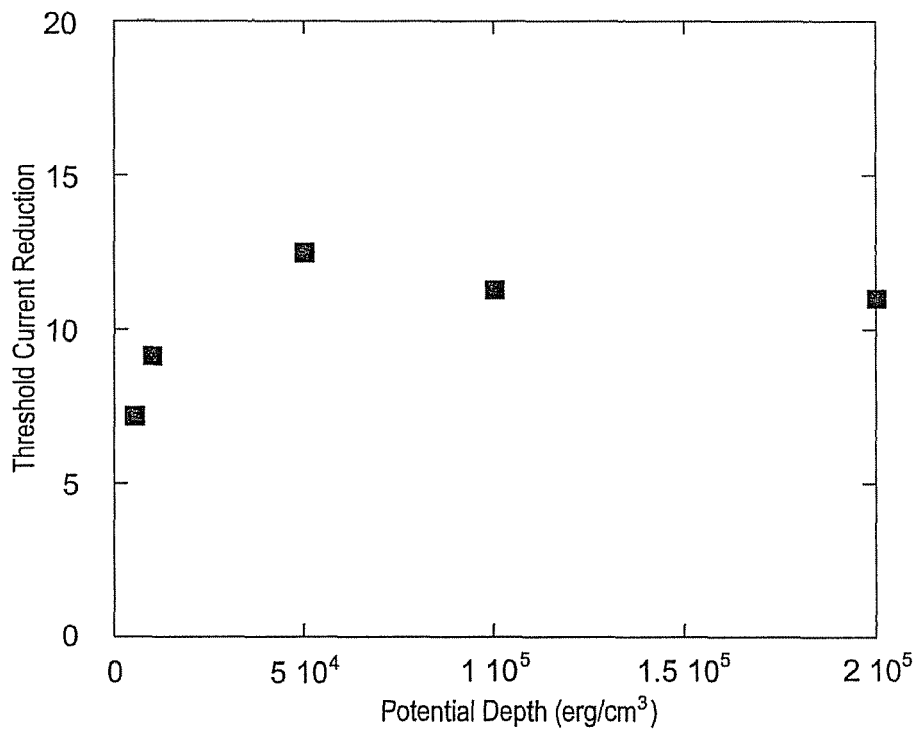

FIGS. 13A and 13B (collectively "FIG. 13") depict a comparison of the domain wall position q versus time for various configurations of pulse length and pulse interval for sequences of 5 pulses with a current amplitude corresponding to a spin torque u of 75 m/s, in accordance with embodiments of the present invention. FIG. 13A depicts both pulse length and pulse intervals being the same, namely 0.5 ns, 0.6 ns, and 0.7 ns, from top to bottom, respectively. FIG. 13B depicts constant pulse length (0.6 ns) and increasing pulse intervals, namely 0.3 ns, 0.6 ns, and 1.2 ns, from top to bottom, respectively. The dotted lines show the boundaries of the potential well (+100 nm). The calculation parameters ($\Delta$, $H_k$, V, $q_0$, $\alpha$, $\beta$, H) have the same numerical values as in FIG. 8.

As shown in FIG. 13, for the same sequence of 5 unipolar pulses with current amplitude corresponding to a spin torque u of 75 m/s, domain wall motion is only achieved when both the pulses length and the interval between the pulses is 0.6 ns, which is about half the precession period of the domain wall motion. Similarly, for bipolar pulses, resonance is achieved when the pulse length for both positive and negative currents is about half the precession period of the domain wall motion.

Based on the preceding discussion relating to FIGS. 10-13 with respect to using current pulses for depinning domain wall motion, the required current amplitude for depinning the domain wall motion is minimal if the pulse length and the interval between the pulses is about half the precession period of the domain wall motion.

3.4 Mapping of the Parameter Space

FIGS. 14-17 are plots of threshold current and reduction thereof versus various parameters, in accordance with embodiments of the present invention. The threshold current facilitates domain wall motion outside of the pinning potential. The parameters in FIGS. 14-17 are: transverse anisotropy field $H_k$ (FIGS. 14A and 14B), domain wall width parameter $\Delta$ (FIGS. 15A and 15B), pinning potential width $q_0$ (FIGS. 16A and 16B), and pinning potential depth V (FIGS. 17A and 17B). FIGS. 14A, 15A, 16A, and 17A depict a plot of threshold current for the embodiments of: dc currents (solid squares), a single pulse with a length half the precession period (solid circles), and a sequence of 4½ bipolar pulses at resonance (solid diamonds). FIGS. 14A, 15A, 16A, and 17A also depict optimal pulse length for achieving maximum threshold current reduction (open squares, right axis of the figures) as well as half of the precession period from the analytical expression given by Equation 6 (dashed curve 89). FIGS. 14A, 15A, 16A, and 17A also depict the curves 87 and 88 representing the analytical expressions of the critical threshold current $u_{c1}$ and $u_{c2}$ in the two depinning regimes of Equations (7) and (8), respectively. FIGS. 14B, 15B, 16B, and 17B depict the ratio of the threshold current for the dc case to the critical current for the 4½ bipolar pulses at resonance case, said ratio corresponding to the factor by which the threshold current is reduced as compared to the dc case.

For FIG. 14, other parameters values employed are: $\Delta$=100 nm, V=$10^5$ erg/cm$^3$, $q_0$=100 nm, $\alpha$=0.01, $\beta$=0.01 and H=0.

For FIG. 15, other parameters values employed are: $H_k=1200$ Oe, $V=10^5$ erg/cm$^3$, $q_0=100$ nm, $\alpha=0.01$, $\beta=0.01$ and H=0.

For FIG. 16, other parameters values employed are: $\Delta=100$ nm, $H_k=1200$ Oe, $V=10^5$ erg/cm$^3$, $\alpha=0.01$, $\beta=0.01$ and H=0.

For FIG. 17, other parameters values employed are: $\Delta=100$ nm, $H_k=1200$ Oe, $q_0=100$ nm, $\alpha=0.01$, $\beta=0.01$ and H=0.

FIGS. 14-17 show that for both the single pulse embodiment (solid circles) and the sequence of 4½ bipolar pulses embodiment (solid diamonds), the threshold current is reduced relative to the use of dc currents (solid squares) for all parameters varied. Moreover, the threshold current reduction exceeded more than one order of magnitude for a wide range of parameter variations.

The discussions supra in Sections 3.2-3.4 demonstrate that the required current amplitude for depinning the domain wall motion is minimal under a resonance condition such that the pulse length and the interval between the pulses is about half the precession period of the domain wall motion. The preceding discussions further demonstrate that the use of current pulses at the resonance condition reduces the required threshold current for depinning domain wall motion relative to a threshold dc current. Therefore, one or more current pulses may be used to reduce the required threshold current for depinning domain wall motion relative to use of a dc current at both the resonance condition or under off-resonance conditions as well. For example, in FIG. 12 the use of 4 bipolar pulses at resonance reduces the threshold current by a factor of about 12. As the pulse length and the pulse interval in time between successive pulses deviates increasingly from one-half the precession period of the domain wall, the threshold current reduction relative to a dc current will decrease until said deviation from resonance (i.e., from one-half the precession period of the domain wall motion) is sufficiently large that the threshold current reduction relative to a dc current is substantially zero or negligible. The maximum permissible deviation from resonance, at which there is a positive threshold current reduction relative to a dc threshold current, is a function of the current pulse configuration (i.e., number of pulses, unipolar versus bipolar pulses, etc.). The present invention includes the following embodiments for using one or more pulses (unipolar or bipolar) within the maximum permissible deviation from resonance.

The present invention provides a method and structure in which a domain wall is in spatial confinement by a pinning potential to within a local region of a magnetic device. At least one current pulse is applied to the domain wall. Each current pulse has a pulse length sufficiently close to a precession period of the domain wall motion and if the at least one current pulse comprises at least two current pulses then the current pulses are separated from each other by a pulse interval sufficiently close to the precession period such that: the at least one current pulse is configured to cause a depinning of the domain wall such that the domain wall moves with sufficient energy to escape the spatial confinement; and each current pulse has an amplitude less than the minimum amplitude of a direct current (i.e., threshold direct current) that would cause said depinning if the direct current were applied to the domain wall instead of the at least one current pulse.

The present invention further provides a method and structure in which a domain wall is in spatial confinement by a pinning potential to within a local region of a magnetic device, subject to at least one current pulse applied to the domain wall, each current pulse having a pulse length in a range of 25% to 75% of a precession period of the domain wall motion, and if the at least one current pulse comprises at least two current pulses then the current pulses are separated from each other by a pulse interval in the range of 25% to 75% of the precession period.

In one embodiment, the pulse length and the pulse interval are each in a range of 25% to 75% of the precession period of the domain wall motion.

In one embodiment, the pulse length and the pulse interval are each in a range of 30% to 70% of the precession period of the domain wall motion.

In one embodiment, the pulse length and the pulse interval are each in a range of 35% to 65% of the precession period of the domain wall motion.

In one embodiment, the pulse length and the pulse interval are each in a range of 40% to 60% of the precession period of the domain wall motion.

In one embodiment, the pulse length and the pulse interval are each in a range of 45% to 55% of the precession period of the domain wall motion.

In one embodiment, the pulse length and the pulse interval are each about 50% of the precession period.

In one embodiment, the at least one current pulse comprises at least two current pulses.

In one embodiment, the pulse interval is about equal to the pulse length.

In one embodiment, the at least two current pulses are unipolar pulses.

In one embodiment, the at least two current pulses are bipolar pulses.

In one embodiment, the amplitude of each pulse is less than the direct current threshold by more than a factor selected from the group consisting of 2, 3, 4, 5, 6, 7, 8, 9, and 10.

In one embodiment, the magnetic device is a magnetic shift register comprising a track of alternating domains of ferromagnetic material as discussed supra in conjunction with FIG. 4, wherein the domain wall is between and in direct contact with a first domain and a second domain of the alternating domains, and wherein the first domain comprises a first ferromagnetic material and the second domain comprises a second ferromagnetic material that differs from the first ferromagnetic material to create the pinning potential.

In another embodiment, the magnetic device is a magnetic shift register comprising a track of alternating domains of ferromagnetic material as discussed supra in conjunction with FIG. 4, wherein the domain wall is between and in direct contact with a first domain and a second domain of the alternating domains, and wherein the domain wall is located at a pinning potential provided in the racetrack memory.

4. Micromagnetic Simulations

Micromagnetic calculations allow for the study of more realistic domain wall structures and their pinning and depinning. Micromagnetic simulations use a finite element method wherein the magnetic system is divided into small elements (typically cubes 2 to 10 nm on each side), which are small enough to behave as simple macro-spins (i.e., large magnetic moments) and which interact with one-another through exchange and magnetostatic forces. The static and dynamic properties of the magnetic system are calculated by solving the Landau-Lifshitz-Gilbert (LLG) equations for each of the magnetic elements. Unlike the one-dimensional model, micromagnetic simulations do not require any approximation of the magnetic configuration beyond the use of macro-spin finite elements. Micromagnetic simulations can account for the fact that domain walls are not rigid objects but can be strongly distorted during their motion. Moreover, micromagnetic simulations can also include the effect of the inhomogeneous self-field created by the electric current flowing through the nanowire. Micromagnetic simulations are in good agreement with the findings of the one-dimensional model described supra. Micromagnetic simulations permit the precessional motion of the domain wall pinned at a defect (e.g., a notch) to be observed for nanowires with various dimensions, with both transverse and vortex head-to-head domain walls. Inertia driven depinning with a single pulse has been demonstrated, via micromagnetic simulations, for these different wall structures.

Figure 18A:
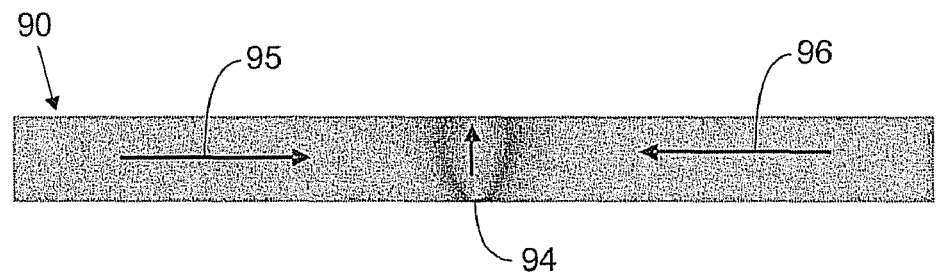
FIG. 18A depicts a map of differently shaded regions, said map showing a head-to-head transverse domain wall, obtained using micromagnetic simulation for a 100 nm wide, 5 nm thick permalloy nanowire, in accordance with embodiments of the present invention.

FIG. 18A depicts a map of differently shaded regions, said map showing a head-to-head transverse domain wall, obtained using micromagnetic simulation for a 100 nm wide, 5 nm thick permalloy nanowire 90, in accordance with embodiments of the present invention. The arrows 95 and 96 indicate the magnetization direction. By removing a small number of the finite elements at the bottom edge of the wire (or setting their moments to zero) a pinning potential in the form of a notch 94 (10×5 nm$^2$) is formed which provides a pinning field of about 27 Oe.

Figure 18B:
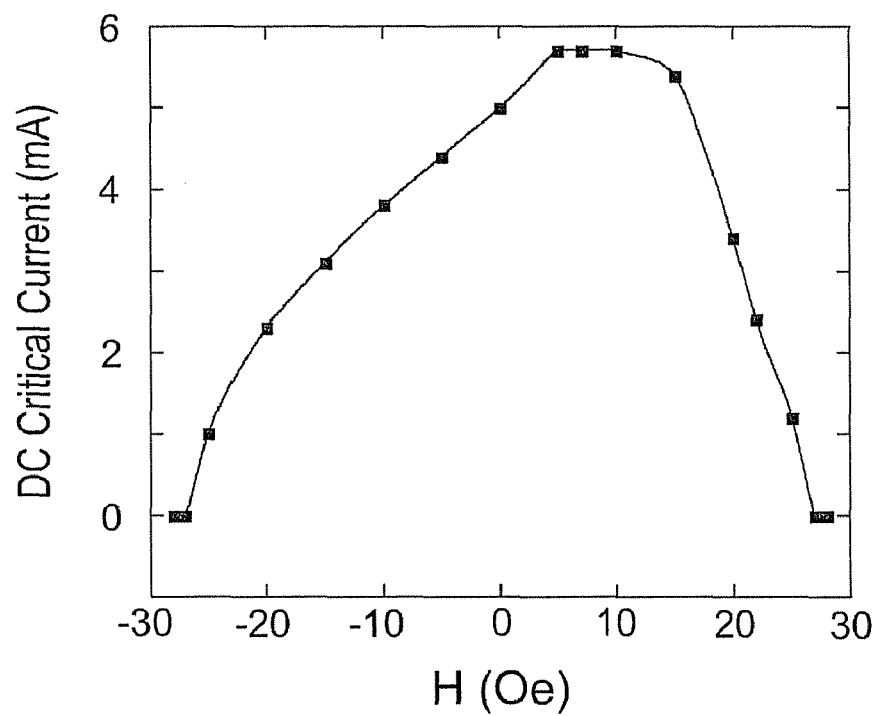
FIG. 18B is a plot of dc critical current for domain wall motion as a function of magnetic field for the domain wall of FIG. 18A, in accordance with embodiments of the present invention.

FIG. 18B is a plot of dc critical current for domain wall motion as a function of an applied magnetic field H for the domain wall 94 of FIG. 18A, in accordance with embodiments of the present invention. FIGS. 18A and 18B are denoted collectively as "FIG. 18". The damping constant $\alpha$ is 0.01, and the non adiabatic spin torque is neglected ($\beta$=0). Note that in the micromagnetic simulations, the other parameters entering the one-dimensional model ($\Delta$, $H_k$, V and $q_0$) are not controlled independently but rather are determined by the material properties, the wire dimensions, and the notch characteristics.

Micromagnetic simulations have been performed with a constant applied magnetic field H=10 Oe. The corresponding dc depinning current is about 5.7 mA (1.14 10$^9$ A/cm$^2$ current density). For dc current smaller than 5.7 mA, the domain wall remains trapped at the notch and undergoes a damped precessional motion. To compare these oscillations with the one dimensional model, the net magnetization, integrated over all the elements forming the nanowire, may be plotted along the nanowire ($M_x$) and perpendicular to the plane of the nanowire ($M_z$). As can been seen in FIG. 6, these two quantities ($M_x$ and $M_z$) are a good description of the domain wall position q and the tilt angle $\Psi$.

Figure 19A:
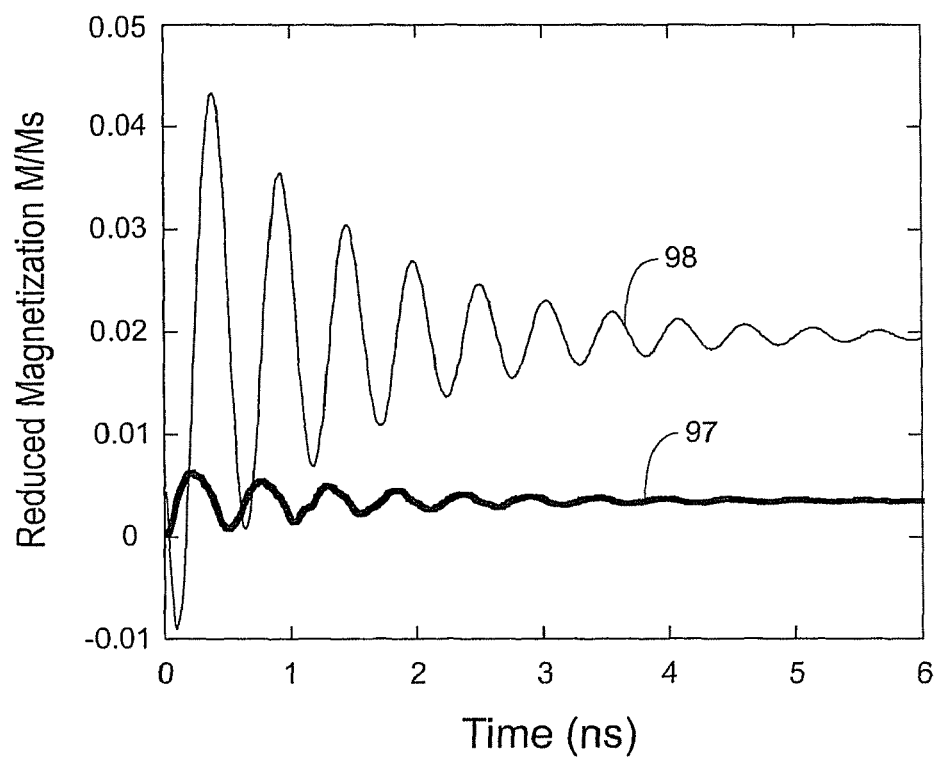
FIGS. 19A and 19B depicts magnetization plots resulting from micromagnetic simulations, in accordance with embodiments of the present invention.
Figure 19B:
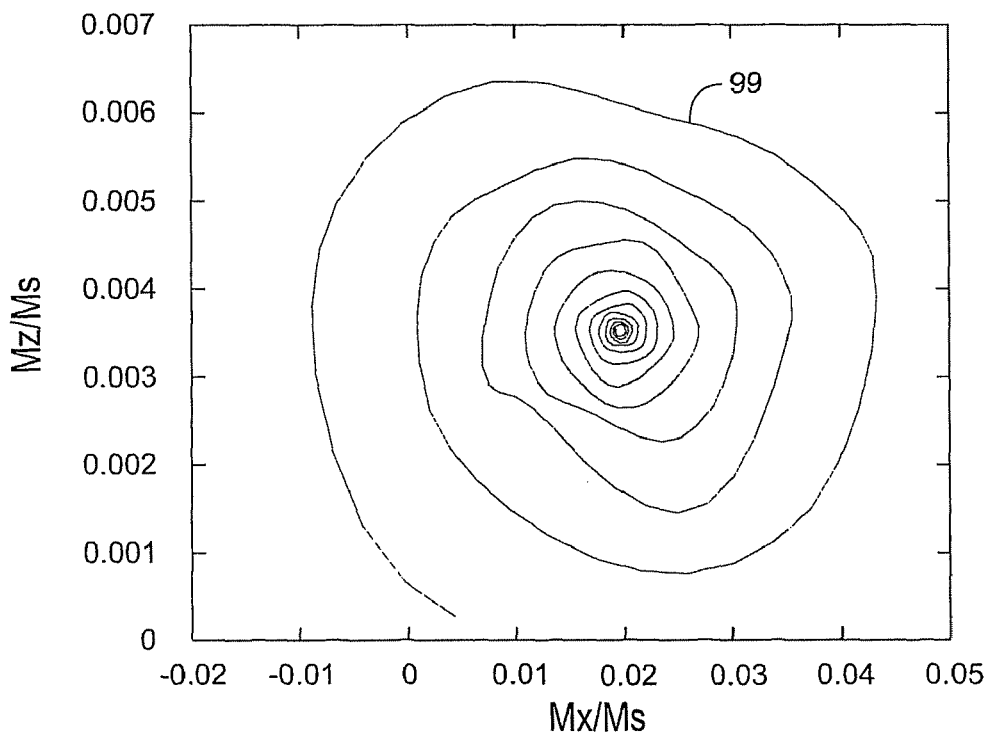

An example of this precessional motion, derived from micromagnetic simulations using the preceding conditions (H=10 Oe, $\alpha$=0.01, $\beta$=0), is shown in FIGS. 19A and 19B (collectively "FIG. 19"). FIG. 19A depicts reduced magnetization Mx/Ms 97 and Mz/Ms 98 as a function of time. FIG. 19B depicts the associated domain wall trajectory 99 in the phase space represented by the magnetization component (Mz/Ms, Mx/Ms). The qualitative agreement between the micromagnetic simulations of FIG. 19 and the one dimensional model is excellent. See FIG. 8 for comparison. The domain wall precession period obtained from this micromagnetic simulation is about 550 ps. The optimum pulse length should then be about 275 ps.

Figures 20A, 20B:
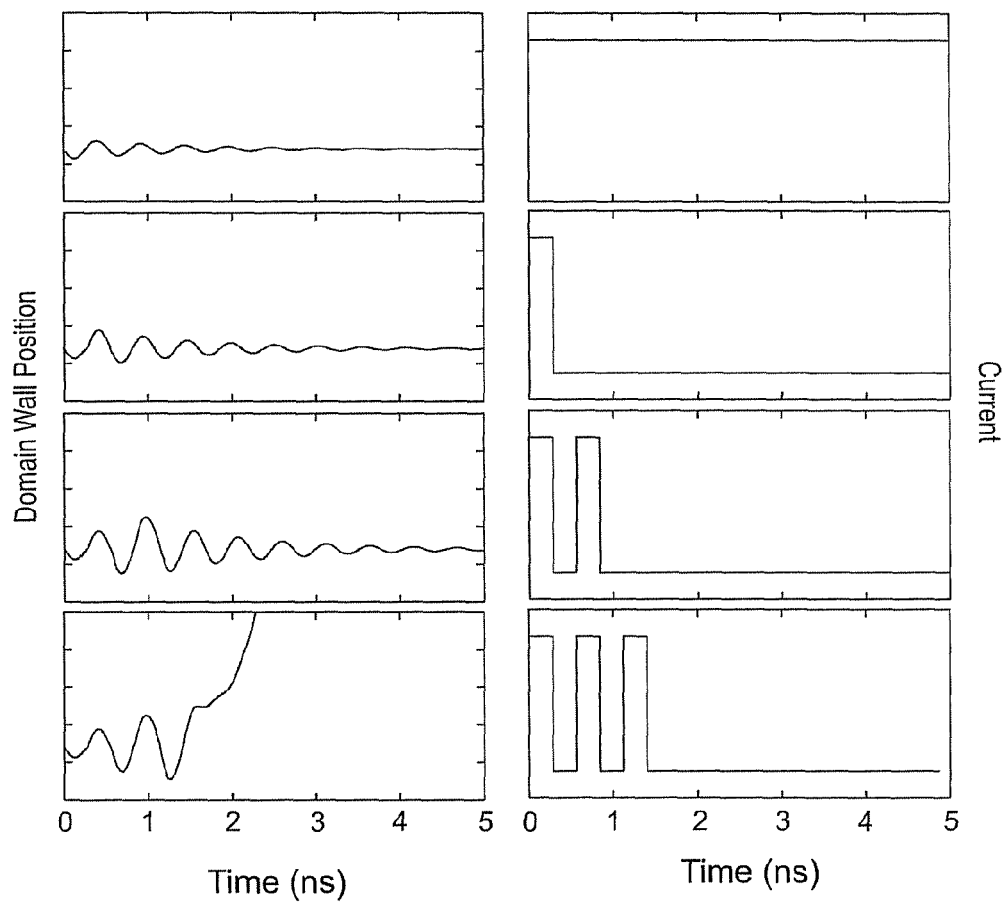
FIG. 20A and FIG. 20B respectively depict domain wall position and electrical current profile versus time from micromagnetic simulations calculated with a current of 1 mA for various sequence of pulses, in accordance with embodiments of the present invention.

FIG. 20A depicts domain wall position versus time from micromagnetic simulations calculated with a current of 1 mA for various sequence of pulses, shown in FIG. 20B, in accordance with embodiments of the present invention. These micromagnetic simulations are performed using the following parameters values: H=10 Oe, $\alpha$=0.01, $\beta$=0. The pulse length used in these calculations is 280 ps, which is very close to the optimum value. For such a small current (i.e., 17.5% of the dc threshold current), the amplitude of the oscillations is rather small for a dc excitation. This amplitude increases significantly for a single pulse and a sequence of 2 pulses, and the domain wall eventually exits the notch after only 3 pulses. This corresponds to a reduction of the critical current by a factor of 5.7. An even stronger reduction is obtained for bipolar pulses. The critical current is only 0.7 mA for 2½ bipolar pulses (factor of 8 reduction).

Micromagnetic simulations exhibit a complex behavior not accessible using the one dimensional model. For example, the domain wall can be strongly distorted during its precession, thus leading to changes in the precession period and loss of resonance conditions when the number of pulses increases.

5. Experimental Support for the Analytical Model

Figure 21:
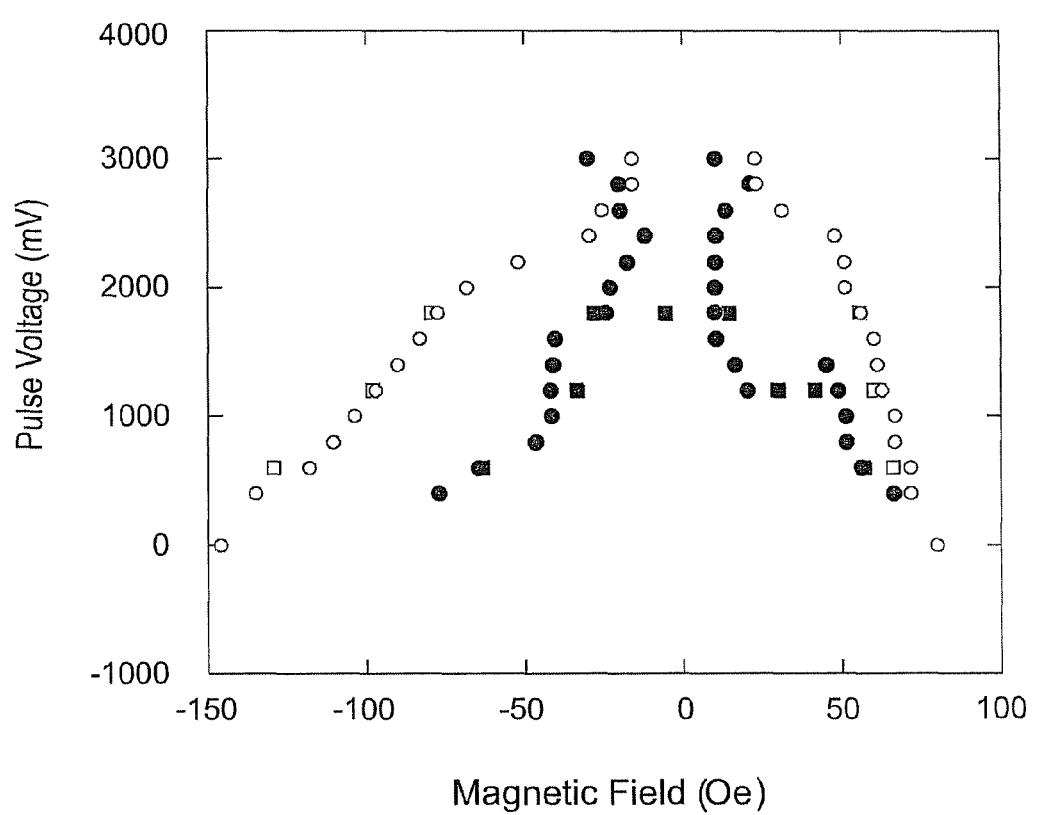
FIG. 21 depicts critical voltage for domain wall motion as a function of applied magnetic field, for 160 pulses, in accordance with embodiments of the present invention.

FIG. 21 depicts critical voltage for domain wall motion as a function of an applied external magnetic field H, for 160 pulses, in accordance with embodiments of the present invention. The critical voltage is defined as the value above which domain wall motion occurs with a probability larger than 50%. Open symbols show a relatively high value of critical voltage outside of resonance conditions (pulse length ~3 ns) and solid symbols show a significantly reduced critical voltage at the first resonance (pulse length ~1.5 ns). It is not possible to estimate the reduction of the critical current at low or zero field in this experiment, since no domain wall motion is observed for dc current or with a single pulse in the voltage range accessible experimentally (i.e., higher voltages would destroy the sample due to excessive currents). However, in the presence of an external magnetic field, the critical current at resonance is reduced by a factor larger than 3. Squares and circles show results for both current polarities, that is current flowing both from left to right and from right to left along the nanowire. Note that for this nanowire 1 volt corresponds to a current density of about 10$^8$ A/cm$^2$.

Thus, the external magnetic field applied to the domain wall is configured to reduce a minimum amplitude of current required of the at least one current pulse applied to the domain wall to cause the depinning of the domain wall, to less than a minimum amplitude of current that would be required of the at least one current pulse to cause the depinning if the external magnetic field were not applied to the domain wall.

Figure 22:
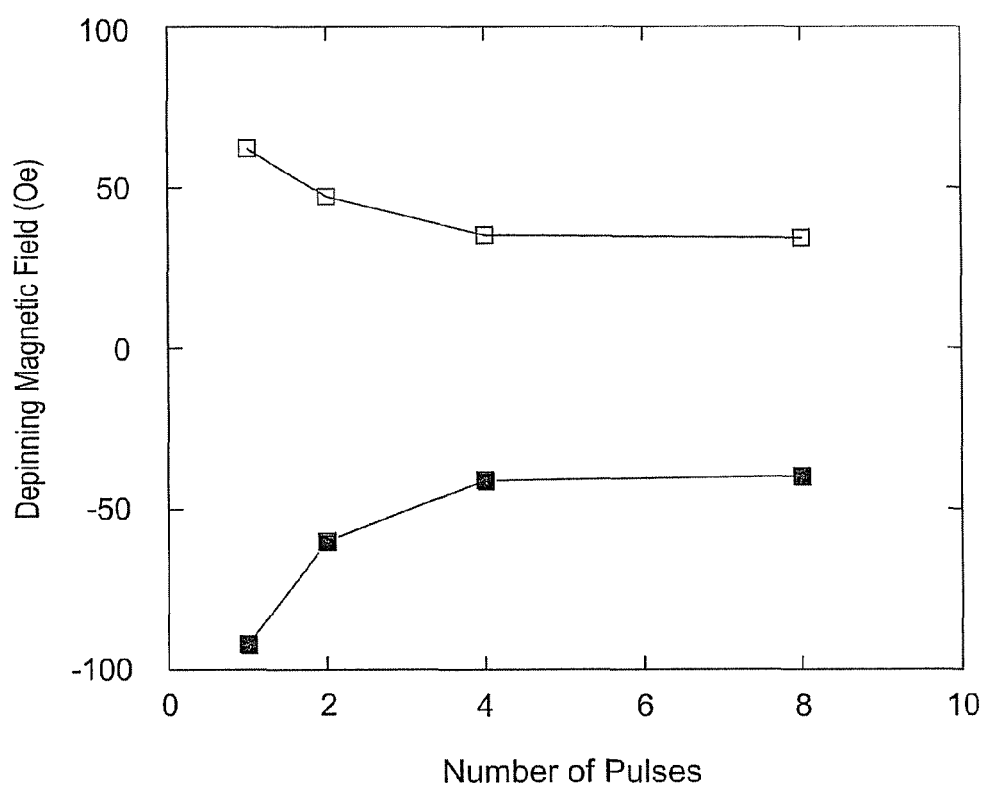
FIG. 22 depicts minimum applied magnetic field required for depinning domain wall motion with a probability larger than 50%, as a function of the number of pulses, for a pulse amplitude of 1.2V, in accordance with embodiments of the present invention.

FIG. 22 depicts minimum applied magnetic field required for depinning domain wall motion with a probability larger than 50%, as a function of the number of pulses, for a pulse amplitude of 1.2V, in accordance with embodiments of the present invention. The resonant depinning mechanism does not require a large number of pulses. Indeed, large effects are already observed for only 2 pulses. This is illustrated on FIG. 22, which shows the depinning fields measured for sequences of 1.2V pulses at resonance, for increasing number of pulses. The resonance is clearly observed for a sequence of only 2 pulses, as shown by the significant reduction of the depinning fields.

The scope of the present invention applies generally to depinning a domain wall in magnetic material (e.g., ferromagnetic material) in any type of magnetic device for any type of pinning potential, through use of electrical current configurations (e.g., a direct current, a current pulse, a sequence of current pulses, etc.) as described supra. The magnetic device may comprise any nanostructured magnetic element (e.g., logic, memory) of any geometric shape (e.g., nanowire, circle, ellipse, prism, column of arbitrary cross-section, U-shaped track as in the shift register of FIGS. 1-4, etc.). The pinning potential is due to a spatial discontinuity in properties of the magnetic material and consequently confines the domain wall by limiting the spatial extent of the magnetic material or by modifying the local magnetic properties of the magnetic material such as by doping, irradiation, etc. In one embodiment, the magnetic device is the shift register of FIG. 4 and the associated pinning potential is due to the alternating magnetic layers therein. The pinning potential may be provided in a magnetic device formed from a homogeneous material by shaping the device, including by shaping the boundary of the device (whether an interior or exterior boundary), including the surfaces or edges. The pinning potential may also be provided in a magnetic device, whether formed from a uniform or a non-uniform magnetic material, by an exterior means. Examples include (a) the passage of current through other nanodevices in the neighborhood of the first device so as to provide local magnetic fields, (b) the bringing into the proximity of the first device other magnetic materials so as to use dipole fields from such materials, and (c) the use of localized electric fields or voltage potentials to locally (i.e., in localized spatial regions) change the magnetic properties of the first device, for example, where the first device if formed from a multiferroic magnetic materials whose magnetic properties (whether magnetization or magnetic anisotropy or any other magnetic property) can be affected by electric field. Similarly, the magnetic properties may be locally altered by means of strain for magnetic materials whose properties are affected by strain or stress. Similarly, the magnetic properties may be locally altered by temperature. Thus by creating local variations of the environment, whether magnetic field, electric field, voltage levels, temperature or strain or stress in cases where the magnetic properties of the first device are sensitive to such environmental parameters, a local pinning potential can be provided from which the domain wall may be manipulated using the embodiments described in this invention.

While experiments have been described with respect to permalloy nanowires, magnetic devices may be formed from a wide variety of magnetic materials.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for depinning a domain wall, comprising applying at least one current pulse to a domain wall that is in spatial confinement by a pinning potential to within a local region of a magnetic device, wherein each current pulse has a pulse length sufficiently close to a precession period of the domain wall motion and if the at least one current pulse comprises at least two current pulses then the current pulses are separated from each other by a pulse interval sufficiently close to the precession period such that:
    the at least one current pulse is configured to cause a depinning of the domain wall such that the domain wall moves with sufficient energy to escape the spatial confinement; and
    each current pulse has an amplitude less than the minimum amplitude of a direct current that would cause said depinning if the direct current were applied to the domain wall instead of the at least one current pulse.

2. The method of claim 1, wherein the at least one current pulse comprises at least two current pulses, and wherein the pulse interval is about equal to the pulse length.

3. The method of claim 2, wherein the pulse length and the pulse interval are each about 50% of the precession period.

4. The method of claim 1, wherein the at least one current pulse comprises at least two current pulses, and wherein the at least two current pulses are unipolar pulses.

5. The method of claim 1, wherein the at least one current pulse comprises at least two current pulses, and wherein the at least two current pulses are bipolar pulses.

6. The method of claim 1, wherein the amplitude of each pulse is less than the minimum direct current by more than a factor of 2.

7. The method of claim 1, further comprising applying an external magnetic field to the domain wall concurrent with said applying the at least one current pulse to the domain wall, said applied external magnetic field configured to reduce a minimum amplitude of current required of the applied at least one current pulse to cause said depinning, to less than a minimum amplitude of current that would be required of the at least one current pulse to cause said depinning if said external magnetic field were not applied to the domain wall.

8. The method of claim 1, wherein the magnetic device is a magnetic shift register comprising a track of alternating domains of ferromagnetic material, wherein the domain wall is between and in direct contact with a first domain and a second domain of the alternating domains, wherein the first domain comprises a first ferromagnetic material, and wherein the second domain comprises a second ferromagnetic material that differs from the first ferromagnetic material to create the pinning potential.

9. A method for depinning a domain wall, comprising:
    applying at least one current pulse to a domain wall that is in spatial confinement by a pinning potential to within a local region of a magnetic device,
    wherein each current pulse has a pulse length in a range of 25% to 75% of a precession period of the domain wall motion and if the at least one current pulse comprises at least two current pulses then the current pulses are separated from each other by a pulse interval in the range of 25% to 75% of the precession period, and
    wherein the applied at least one current pulse is configured to cause a depinning of the domain wall such that the domain wall moves with sufficient energy to escape the spatial confinement.

10. The method of claim 9, wherein the at least one current pulse comprises at least two current pulses.

11. The method of claim 10, wherein the pulse interval is about equal to the pulse length.

12. The method of claim 11, wherein the pulse length and the pulse interval are each about 50% of the precession period.

13. A structure, comprising a domain wall that is in spatial confinement by a pinning potential to within a local region of a magnetic device and at least one current pulse applied to the domain wall, wherein each current pulse has a pulse length sufficiently close to a precession period of the domain wall motion and if the at least one current pulse comprises at least two current pulses then the current pulses are separated from each other by a pulse interval sufficiently close to the precession period such that:
    the at least one current pulse is configured to cause a depinning of the domain wall such that the domain wall moves with sufficient energy to escape the spatial confinement; and
    each current pulse has an amplitude less than the minimum amplitude of a direct current that would cause said depinning if the direct current were applied to the domain wall instead of the at least one current pulse.

14. The structure of claim 13, wherein the at least one current pulse comprises at least two current pulses, and wherein the pulse interval is about equal to the pulse length.

15. The structure of claim 14, wherein the pulse length and the pulse interval are each about 50% of the precession period.

16. The structure of claim 13, wherein the at least one current pulse comprises at least two current pulses, and wherein the at least two current pulses are unipolar pulses.

17. The structure of claim 13, wherein the at least one current pulse comprises at least two current pulses, and wherein the at least two current pulses are bipolar pulses.

18. The structure of claim 13, wherein the amplitude of each pulse is less than the minimum direct current by more than a factor of 2.

19. The structure of claim 13, further comprising an external magnetic field applied to the domain wall, said applied external magnetic field configured to reduce a minimum amplitude of current required of the applied at least one current pulse to cause said depinning, to less than a minimum amplitude of current that would be required of the at least one current pulse to cause said depinning if said external magnetic field were not applied to the domain wall.

20. The structure of claim 13, wherein the magnetic device is a magnetic shift register comprising a track of alternating domains of ferromagnetic material, wherein the domain wall is between and in direct contact with a first domain and a second domain of the alternating domains, wherein the first domain comprises a first ferromagnetic material, and wherein the second domain comprises a second ferromagnetic material that differs from the first ferromagnetic material to create the pinning potential.

21. A structure, comprising:

a domain wall that is in spatial confinement by a pinning potential to within a local region of a magnetic device; and at least one current pulse applied to the domain wall, wherein each current pulse has a pulse length in a range of 25% to 75% of a precession period of the domain wall motion and if the at least one current pulse comprises at least two current pulses then the current pulses are separated from each other by a pulse interval in the range of 25% to 75% of the precession period, and wherein the applied at least one current pulse is configured to cause a depinning of the domain wall such that the domain wall moves with sufficient energy to escape the spatial confinement.

22. The structure of claim 21, wherein the at least one current pulse comprises at least two current pulses.

23. The structure of claim 22, wherein the pulse interval is about equal to the pulse length.

24. The structure of claim 23, wherein the pulse length and the pulse interval are each about 50% of the precession period.

\* \* \* \* \*